(12) United States Patent
Fujita et al.

(10) Patent No.: US 11,462,780 B2
(45) Date of Patent: Oct. 4, 2022

(54) CHARGE/DISCHARGE CONTROL APPARATUS, CONDITION-OF-USE CREATION APPARATUS, NON-TRANSITORY COMPUTER READABLE MEDIUM, AND POWER STORAGE SYSTEM

(71) Applicant: Kabushiki Kaisha Toshiba, Minato-ku (JP)

(72) Inventors: Yumi Fujita, Chuo (JP); Tomokazu Morita, Funabashi (JP); Nobukatsu Sugiyama, Kawasaki (JP); Ena Ishii, Yokohama (JP); Wataru Aratani, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 253 days.

(21) Appl. No.: 15/685,054

(22) Filed: Aug. 24, 2017

(65) Prior Publication Data

US 2018/0261893 A1 Sep. 13, 2018

(30) Foreign Application Priority Data

Mar. 8, 2017 (JP) .............................. JP2017-044220

(51) Int. Cl.
*H01M 10/48* (2006.01)
*G01R 31/3842* (2019.01)
(Continued)

(52) U.S. Cl.
CPC .... *H01M 10/486* (2013.01); *G01R 19/16542* (2013.01); *G01R 31/3842* (2019.01); *G01R 31/392* (2019.01); *H01M 10/44* (2013.01); *H02J 7/0021* (2013.01); *H02J 7/0031* (2013.01); *H02J 7/0047* (2013.01); (Continued)

(58) Field of Classification Search
None
See application file for complete search history.

(56) References Cited

U.S. PATENT DOCUMENTS 8,684,596 B2 4/2014 Nishi et al.
9,153,845 B2 10/2015 Tanaka et al.
(Continued)

FOREIGN PATENT DOCUMENTS

CN 103329339 A 9/2013
CN 105958132 A 9/2016
(Continued)

OTHER PUBLICATIONS

Chinese Office Action dated Apr. 25, 2021, issued in Chinese Patent Application No. 201710770133.0.

*Primary Examiner* — Karie O'neill Apicella
(74) *Attorney, Agent, or Firm* — Oblon, McClelland, Maier & Neustadt, L.L.P.

(57) ABSTRACT

A charge/discharge control apparatus according to one aspect of the present invention is an apparatus that controls charge or discharge of a secondary battery to be charged or discharged on the basis of at least one condition of use calculated from a deterioration model or a deterioration map of a secondary battery and at least one inner state parameter of the secondary battery to be charged or discharged. The charge/discharge control apparatus updates the condition of use on the basis of change of the inner state parameter.

15 Claims, 19 Drawing Sheets

(51) Int. Cl.
    *H02J 7/00*      (2006.01)
    *G01R 31/392*    (2019.01)
    *G01R 19/165*    (2006.01)
    *H01M 10/44*     (2006.01)
    *H02J 7/04*      (2006.01)
    *H01M 10/42*     (2006.01)

(52) U.S. Cl.
    CPC .............. *H02J 7/0069* (2020.01); *H02J 7/04* (2013.01); *H01M 10/4257* (2013.01)

(56) References Cited

U.S. PATENT DOCUMENTS

| | | | |
|---|---|---|---|
| 9,203,253 | B2 | 12/2015 | Nomoto |
| 9,213,070 | B2 | 12/2015 | Hoshino et al. |
| 9,678,167 | B2 * | 6/2017 | Goto .................... G01R 31/392 |
| 9,963,043 | B2 | 5/2018 | Kirimoto |
| 2007/0166607 | A1 | 7/2007 | Okada et al. |
| 2008/0241666 | A1 | 10/2008 | Baba et al. |
| 2009/0112496 | A1 | 4/2009 | Suzuki |
| 2011/0086248 | A1 | 4/2011 | Nakura |
| 2015/0160300 | A1 | 6/2015 | Ishii et al. |
| 2015/0260798 | A1 | 9/2015 | Sugiyama et al. |
| 2016/0264017 | A1 | 9/2016 | Komiyama |

FOREIGN PATENT DOCUMENTS

| | | | |
|---|---|---|---|
| EP | 2 325 664 A1 | 5/2011 | |
| EP | 3 076 518 A1 | 10/2016 | |
| EP | 3 086 133 A1 | 10/2016 | |
| EP | 3086133 A1 * | 10/2016 | ............. G01R 31/36 |
| JP | 3349321 | 11/2002 | |
| JP | 2007-220658 | 8/2007 | |
| JP | 2007-323999 | 12/2007 | |
| JP | 2008-192437 | 8/2008 | |
| JP | 2011-18532 A | 1/2011 | |
| JP | 2011-086530 | 4/2011 | |
| JP | 2012-251806 | 12/2012 | |
| JP | 2013-240236 | 11/2013 | |
| JP | 5537521 | 7/2014 | |
| JP | 2015-111086 | 6/2015 | |
| JP | 2015-118022 A | 6/2015 | |
| JP | 2015-171197 A | 9/2015 | |
| JP | 2015-175753 | 10/2015 | |
| JP | 2016-167368 | 9/2016 | |
| WO | WO 2009/147854 A1 | 12/2009 | |
| WO | WO 2012/039412 A1 | 3/2012 | |
| WO | WO 2015/098012 A1 | 7/2015 | |

* cited by examiner

CHARGE/DISCHARGE CONTROL APPARATUS, CONDITION-OF-USE CREATION APPARATUS, NON-TRANSITORY COMPUTER READABLE MEDIUM, AND POWER STORAGE SYSTEM

CROSS-REFERENCE TO RELATED APPLICATION(S)

This application is based upon and claims the benefit of priority from Japanese Patent Application No. 2017-044220, filed Mar. 8, 2017; the entire contents of which are incorporated herein by reference.

FIELD

Embodiments described herein relate generally to a charge/discharge control apparatus, a condition-of-use creation apparatus, a non-transitory computer readable medium, and a power storage system.

BACKGROUND

For secondary batteries (storage batteries) such as lithium ion secondary batteries, conditions of use are provided in order to prevent their rapid deterioration. For example, the conditions of use include ranges of currents in charging and discharging, a range of a state of charge (SOC), a voltage width based on the SOC range, and the like. Defining such conditions of use limits charge and discharge of a secondary battery. For example, an electric vehicle can charge a secondary battery at a downward slope through regeneration, but it does not perform the charge when the SOC of the secondary battery exceeds the upper limit of the SOC range.

Now, conditions of use are often defined regardless of the state of a secondary battery in general battery control of a power storage system. In other words, the conditions of use are often the same both in the initial period of the life of the secondary battery and in the final period of the life thereof. Therefore, when the voltage width, for example, is set to be narrow, the secondary battery cannot sufficiently show its battery performance in the initial period of the life. Meanwhile, when the voltage width is set to be wide, its deterioration is accelerated in the final period of the life. Moreover, the life of the secondary battery largely varies depending on its usage by a user.

Therefore, methods for changing the conditions of use in accordance with the state of the secondary battery have been proposed. Nevertheless, it is difficult to simply grasp the present deterioration of the secondary battery since deterioration of the secondary battery are caused by various factors of a positive electrode, a negative electrode, an electrolytic solution and the like. Moreover, even if estimation of the present deterioration of the secondary battery is tried from past measurement data, accuracy of the estimation is low since deterioration of the secondary battery does not always progress constantly. According to such situations, it is difficult to calculate appropriate conditions of use in accordance with the present deterioration.

DETAILED DESCRIPTION

According to an embodiment of the present invention, a condition of use in accordance with an inner state during use is calculated in order to suppress deterioration of a secondary battery.

A charge/discharge control apparatus according to one aspect of the present invention is an apparatus that controls charge or discharge of a secondary battery to be charged or discharged on the basis of at least one condition of use calculated from a deterioration model or a deterioration map of a secondary battery and at least one inner state parameter of the secondary battery to be charged or discharged. The charge/discharge control apparatus updates the condition of use on the basis of change of the inner state parameter.

Below, a description is given of embodiments of the present invention with reference to the drawings. The present invention is not limited to the embodiments.

First Embodiment

Figure 1:
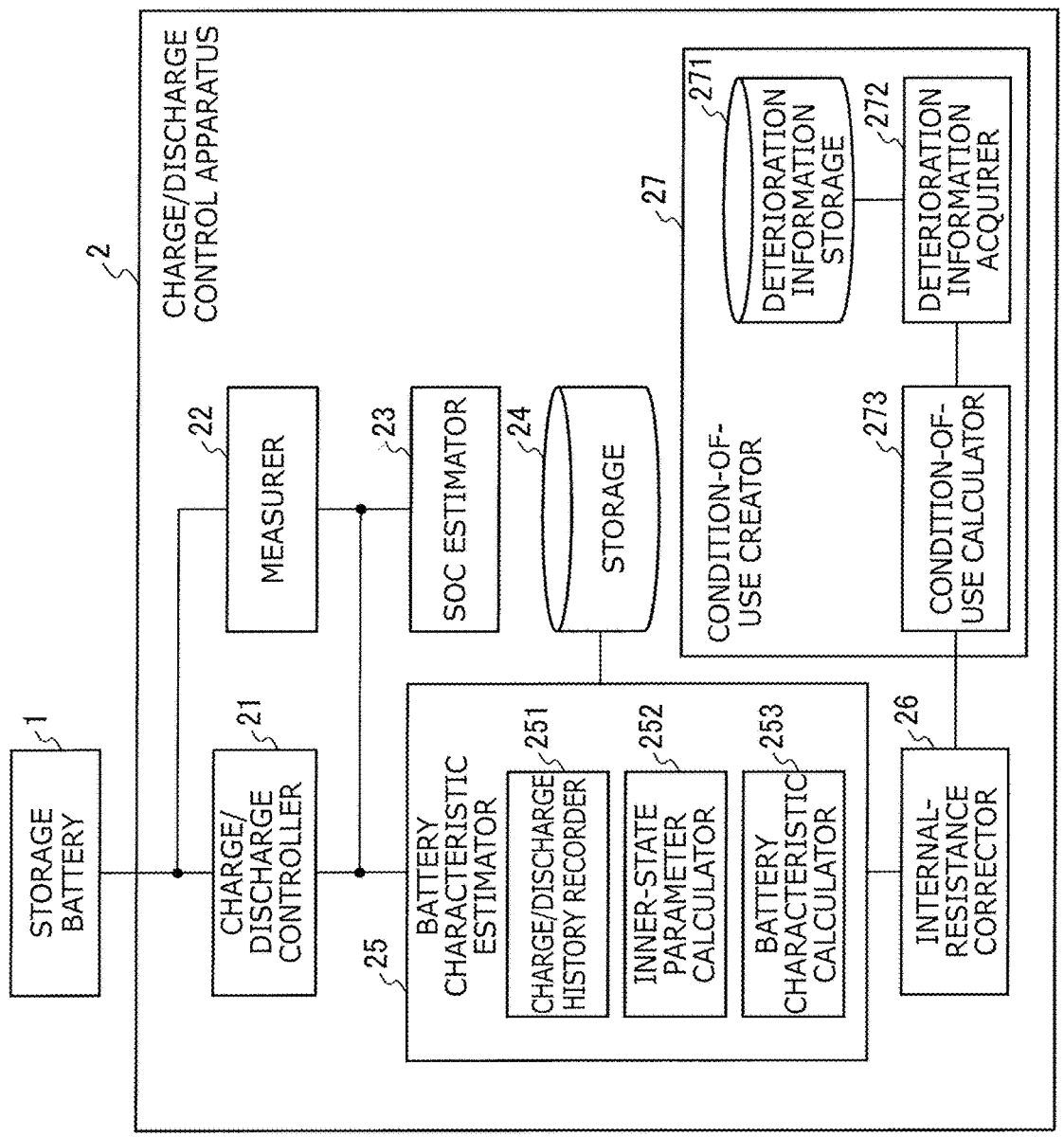
FIG. 1 is a block diagram illustrating an example of a schematic configuration of a power storage system including a charge/discharge control apparatus according to a first embodiment.

FIG. 1 is a block diagram illustrating an example of a schematic configuration of a power storage system including a charge/discharge control apparatus according to a first embodiment. The power storage system includes a storage battery 1 (a first battery) and a charge/discharge control apparatus 2. The charge control apparatus 2 includes a charge/discharge controller 21, a measurer 22, an SOC (state of charge) estimator 23, a storage 24, a battery characteristic estimator 25, an internal-resistance corrector 26, and a condition-of-use creator 27. The battery characteristic estimator includes a charge/discharge history recorder 251, an inner-state parameter calculator 252, and a battery characteristic calculator 253. The condition-of-use creator 27 includes a deterioration information storage 271, a deterioration information acquirer (reference data acquirer) 272, and a condition-of-use calculator 273.

The charge/discharge control apparatus 2 realized by a CPU circuit or the like may be provided to the storage battery 1 such that the charge/discharge control apparatus 2 is realized so as to be integrated with the storage battery 1.

The storage battery 1 is a battery to be charged/discharge by the charge/discharge control apparatus 2. Notably, charge/discharge may mean any one of charge and discharge or may mean both of them. The storage battery 1 may be a unit cell, or may be provided with one or more battery packs (assembled battery). Each of the battery packs may include one or more battery modules. Each of the battery modules may include a plurality of unit cells. The battery packs may have the same number of the battery modules, or may have the different number of battery modules. The battery modules may have the same number of unit cells, or may have the different number of unit cells.

The unit cell may be any secondary battery as long as the secondary battery can be recharged and discharged. The description herein is given assuming that the secondary battery is a lithium ion secondary battery.

In the description below, unless otherwise mentioned, the term "storage battery" includes a battery pack, a battery module, and a unit cell.

The storage battery 1 may be a storage battery for storage battery-installed devices such, for example, as cellular phones, laptop computers, electric bicycles, electric vehicles, hybrid vehicles using both electricity and gasoline, and drones. Further, the storage battery 1 may be a stationary storage battery that is installed for each structure such as a private house, a building, and a factory. The storage battery 1 may be a storage battery linked with, or interconnected with a power generation system.

The charge/discharge control apparatus 2 controls charge/discharge of the storage battery 1. Moreover, the charge/discharge control apparatus 2 also estimates the state of the storage battery 1 connected thereto. Then, the charge/discharge control apparatus 2 calculates conditions of use of the storage battery 1 on the basis of the estimated state of the storage battery 1. Then, the charge/discharge control apparatus 2 controls charge/discharge of the storage battery 1 on the basis of the calculated conditions of use. The estimation of the state of the storage battery 1 is to estimate inner state parameters and battery characteristics which are information regarding the state of the storage battery 1 on the basis of data on voltage and current of the storage battery 1 measured in charging/discharging the storage battery 1. The inner state parameters and the battery characteristics will be described later.

A method for estimating the state of the storage battery 1 on the basis of the frequency of use or the number of times of use may be adopted. However, the state of a storage battery may vary depending on the use environment or a load even when the frequency of use or the number of times of use is same. Accordingly, in order to estimate the state of the storage battery 1 with high accuracy, the charge/discharge control apparatus 2 estimates the state or performance of the storage battery 1, from measurement values obtained through an inspection of charge and discharge or the like.

The conditions of use of the storage battery 1 are constraint conditions used in use of the storage battery 1, in other words, in charging/discharging the storage battery 1. The conditions of use may include, for example, a voltage width, an SOC range, a current width (width of a charge/discharge current value or a charge/discharge rate), a power width and a temperature width in use, and the similar conditions. Notably, while each of the width and the range is meant to be between the upper limit and the lower limit, the upper limit and the lower limit may be the same. In other words, each condition of use may be one value. Moreover, any one of the upper limit and the lower limit may be defined, the other being absent. For example, a condition of use may be that a current in charging is not more than 10 A.

While the conditions of use may have been predefined, the conditions of use are needed to be updated since the storage battery deteriorates with its use. If the storage battery 1 after deterioration is charged/discharged under conditions of use before the storage battery 1 deteriorates, the capacity of the storage battery 1 decreases. Furthermore, deterioration of the storage battery 1 is possibly accelerated. Hence, the conditions of use suitable for the storage battery 1 to be used are needed to be calculated and updated in accordance with the state of the storage battery 1 to be used. Therefore, the charge/discharge control apparatus 2 of the present embodiment updates the conditions of use on the basis of change of the inner state parameters and the battery characteristics. By the conditions of use being updated, in accordance with the state of the storage battery 1, to conditions under which a usable range is wide while suppressing deterioration progress, the chargeable/dischargeable capacity can be secured while preventing the life of the storage battery 1 from deteriorating. Moreover, by the conditions of use being provided, charge/discharge that increases safety risks such as firing is not performed, for example, under conditions for charge/discharge with large current, charge/discharge at high temperature, or the like. Accordingly, the safety in charge/discharge can be ensured.

The charge/discharge control apparatus 2 is assumed to use deterioration information (reference data) in order to perform a process for calculating a condition of use. The description of deterioration information will be given later. The description of details of operations of the charge/discharge control apparatus 2 will be also given later.

The system configuration described above is an example, and the present invention is not limited to the above configuration. For example, in FIG. 1, the charge/discharge control apparatus 2 includes the storage 24 and the deterioration information storage 271. However, the storage 24 and the deterioration information storage 271 may be configured into a single storage. In addition, the charge control/discharge apparatus 2 may be connected to a separate device or the like such that a condition of use is outputted from the charge/discharge control apparatus 2 to the separate device. The output method here is not limited to a particular one. In the output method, a file, an e-mail, an image or the like may be used. The internal-resistance corrector 26 may be included in the battery characteristic estimator 25.

As long as information necessary for a process is received from the charge/discharge control apparatus 2 and the process result is transferred to the charge/discharge control apparatus 2 by communication or an electrical signal, the components of the charge/discharge control apparatus 2 may be outside the charge/discharge control apparatus 2. For example, as long as estimation values of the battery characteristics or the like are received from the charge/discharge control apparatus 2 and the conditions of use are transferred to the charge/discharge control apparatus 2 through communication or electric signals, the condition-of-use creator 27 may be a device (condition-of-use creation apparatus) outside the charge/discharge control apparatus 2.

Moreover, the charge/discharge control apparatus 2 may be connected to another device. For example, power may be supplied from an EV-ECU (electronic vehicle-electronic control unit), which controls an electric vehicle, to the charge/discharge control apparatus 2. Otherwise, the charge/discharge control apparatus 2 may be a component of the EV-ECU.

Figure 2A:
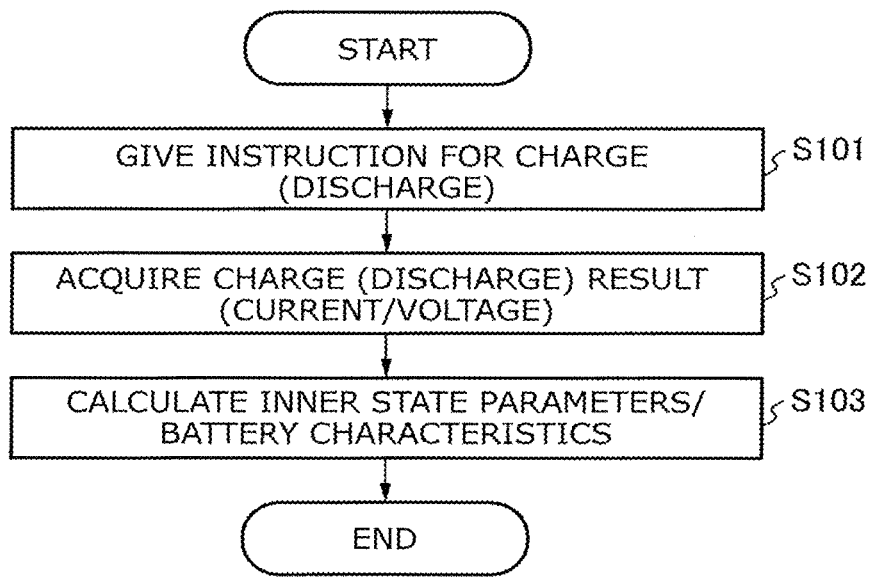
FIGS. 2A and 2B illustrate an example of a flowchart of a schematic process in the charge/discharge control apparatus.
Figure 2B:
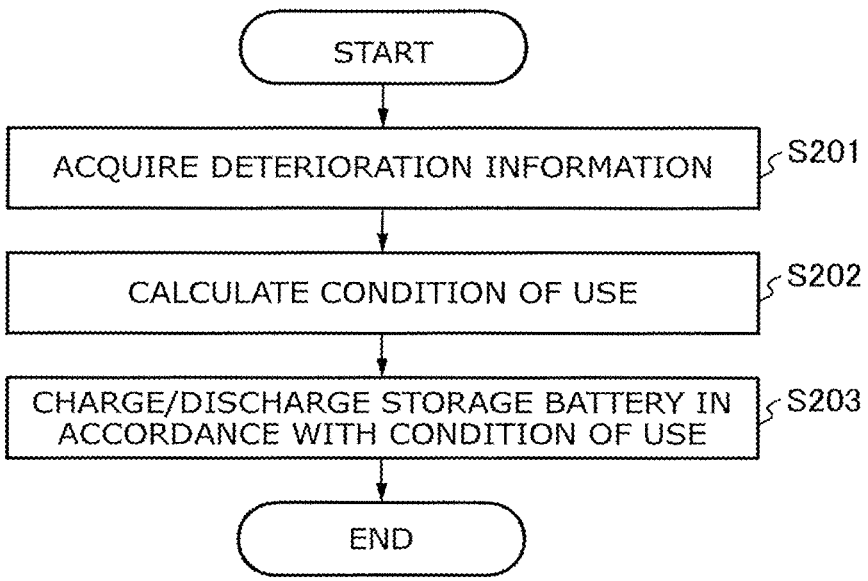

FIGS. 2A and 2B illustrate an example of a flowchart of a schematic process in the charge/discharge control apparatus. FIG. 2A illustrates a process for grasping the state of the storage battery 1. This process is performed in order to grasp the state of the storage battery 1 which has changed due to deterioration or the like, and is assumed to be performed every predetermined time period. FIG. 2B illustrates a process for charging/discharging on the basis of the conditions of use. This process is assumed to be performed after the process in FIG. 2A in order to initially create a condition of use of the storage battery 1 or to recreate a condition of use due to determination that the state of the storage battery 1 has changed. However, the processes may be performed at a timing other than the above. The process of FIG. 2A may be performed when a voltage rise or a voltage drop is detected in the storage battery 1 or in any of the unit cells constituting the storage battery 1 during charge/discharge, in other words, during the process of FIG. 2B.

The process for grasping the state of the storage battery 1 is described. The charge/discharge control apparatus 2 gives the storage battery 1 an instruction to be charged (or discharged) under a predetermined condition (S101). The charge/discharge control apparatus 2 acquires the charge (discharge) result from the storage battery 1 (S102), and analyzes the charge result (S103). Analyzing the charge result is calculating the inner state parameters and the battery characteristics (cell characteristics) of each unit cell on the basis of the charge result. More specifically, the inner state parameters are estimated on the basis of current and voltage data measured during the charge and discharge. Further, the battery characteristics are estimated on the basis of the inner state parameters.

The inner state parameters each indicate the state of a unit cell. The inner state parameters are assumed to include a positive electrode capacity (the mass of the positive electrode), a negative electrode capacity (the mass of the negative electrode), an SOC deviation, and an internal resistance. The SOC deviation means a difference between the initial charge amount of the positive electrode and the initial charge amount of the negative electrode.

The battery characteristics can be calculated from the inner state parameters, and represent characteristics including the voltage of the storage battery 1. The battery characteristics are assumed to include a battery capacity, an open circuit voltage (OCV), an OCV curve, and the like. The internal resistance may be included also in the battery characteristics. The OCV curve means a graph (a function) indicating the relationship between the open circuit voltage and a certain index regarding the storage battery. The battery capacity is within a range in which the positive electrode capacity range overlaps with the negative electrode capacity range. When the SOC is 100%, the potential difference between the positive electrode and the negative electrode is an end-of-charge voltage. When the SOC is 0%, the potential difference between the positive electrode and the negative electrode is an end-of-discharge voltage. In this way, the battery capacity can be calculated on the basis of a charge amount.

The process of the charge/discharge on the basis of the condition of use is described. The charge/discharge control apparatus 2 acquires deterioration information from the deterioration information storage 271 (S201). Subsequently, a condition of use is calculated on the basis of deterioration information regarding the calculated inner state parameters or the calculated battery characteristics (cell characteristics) and the instruction value of a deterioration speed (S202). Notably, in spite of stating the specified value of the deterioration speed, a range of the deterioration speed may be specified. The specified value is supposed to include the specified range. Details thereof will be described later. The charge/discharge control apparatus 2 charges/discharges the storage battery 1 so as to satisfy the calculated conditions of use (S203). Thereby, charge/discharge is performed under the conditions of use suitable for the storage battery 1. For example, in the case where the SOC range is defined in the conditions of use, when the charge/discharge control apparatus 2 has performed charge up to the upper limit of the SOC range, the charge/discharge control apparatus 2 stops the charge. Otherwise, in the case where a range of the value of the current is defined in the conditions of use, when a current exceeding the upper limit is supplied from the EV-ECU or the like, the charge/discharge control apparatus 2 may allow an unnecessary current to escape.

Next, the components included in the charge/discharge control apparatus 2 will be described.

The charge/discharge controller 21 gives the storage battery 1 an instruction of charge/discharge for measurement in order to measure the inner state parameters of the storage battery 1. The charge and discharge for measurement needs to be performed before change in the state of the storage battery 1 becomes not negligible due to progress of deterioration of the unit cells. For this reason, the charge/discharge for measurement is performed every appropriately time period, or at appropriately determined time intervals, which are determined considering variation in the battery characteristics. The charge/discharge controller 21 may also give a charge or discharge for measurement instruction when receiving an instruction from a user, another system, or the like via an input device (not illustrated).

Moreover, the charge/discharge controller 21 charges/discharges the storage battery 1 for use on the basis of the conditions of use created by the condition-of-use creator 27. Notably, the charge/discharge control apparatus 2 may perform the process until the creation of the conditions of use is completed, and a device other than the charge/discharge control apparatus 2 may perform the charge/discharge based on the conditions of use. In other words, a charge/discharge control apparatus that charges/discharges the storage battery 1 in order to estimate the battery characteristics and a charge/discharge control apparatus that charges/discharges the storage battery 1 using the conditions of use may be different from each other.

The measurer 22 measures information about the storage battery 1. Examples of the information to be measured include the voltage between positive electrode terminals and negative electrode terminals of unit cells, current flowing through unit cells, and the temperatures of unit cells. Data measured by the measurer 22 includes the voltage, the current, and the temperature of the storage battery 1 which are measured during charge or discharge of the storage battery 1.

The SOC estimator 23 estimates the present SOC (state of charge) of the storage battery 1 on the basis of the data measured by the measurer 22. The SOC may be estimated using an SOC-OCV curve calculated by the battery characteristic estimator 25 on the basis of the present state of the storage battery 1.

The storage 24 stores data to be used for a process according to the battery characteristic estimator 25. For example, the storage 24 stores a function showing the relationship between the charge amount and the potential of the positive electrode or the negative electrode of a unit cell. The storage 24 may store other data.

The battery characteristic estimator 25 calculates the present inner state parameters and the present battery characteristics of the storage battery 1 on the basis of the data measured by the measurer 22. The battery characteristics may not be calculated, if unneeded. As described above, the battery characteristics include a battery capacity, an internal resistance, an open circuit voltage (OCV), and an OCV curve. The OCV curve (a function) may be a function showing the relationship between the open circuit voltage (OCV) of the secondary battery and the charge state of the secondary battery or the quantity of electric charges charged in the secondary battery, for example. Alternatively, the OCV curve may be an SOC-OCV graph which illustrates the relationship between the SOC and the OCV, or may be a charge amount-OCV graph which illustrates the relationship between the charge amount and the OCV. The type of an OCV curve to be calculated may be defined in advance.

To calculate the battery characteristics, various types of a battery characteristics measurement method can be used. More specifically, the examples of the method include a charge or discharge experiment in which a battery capacity is actually measured by supplying current, a current pausing method in which an internal resistance value is mainly measured, and an electrochemical measurement such as an AC impedance measurement. Measurement may be performed by combination thereof. Alternatively, a method in which battery characteristics are simply estimated by analyzing a charge or discharge curve may be used.

The inner configuration of the battery characteristic estimator 25 is described.

The charge/discharge history recorder 251 records data (a history) of voltages, currents, and temperatures, or the like measured by the measurer 22 during charge or discharge of the storage battery 1. The recording is repeatedly performed at predetermined time intervals from start of charge/discharge to completion of the charge of the storage battery 1. The time intervals may be freely set according to a process in which the record is to be used. For example, the time intervals may be set to approximately 0.1 to 1 second intervals. A time at which the recoding is performed may be an absolute time, or may be a relative time which is counted from start of charge/discharge. When the process performed by the charge/discharge history recorder 251 is repeated at the predetermined time intervals, recording of a time may be omitted.

Figure 3:
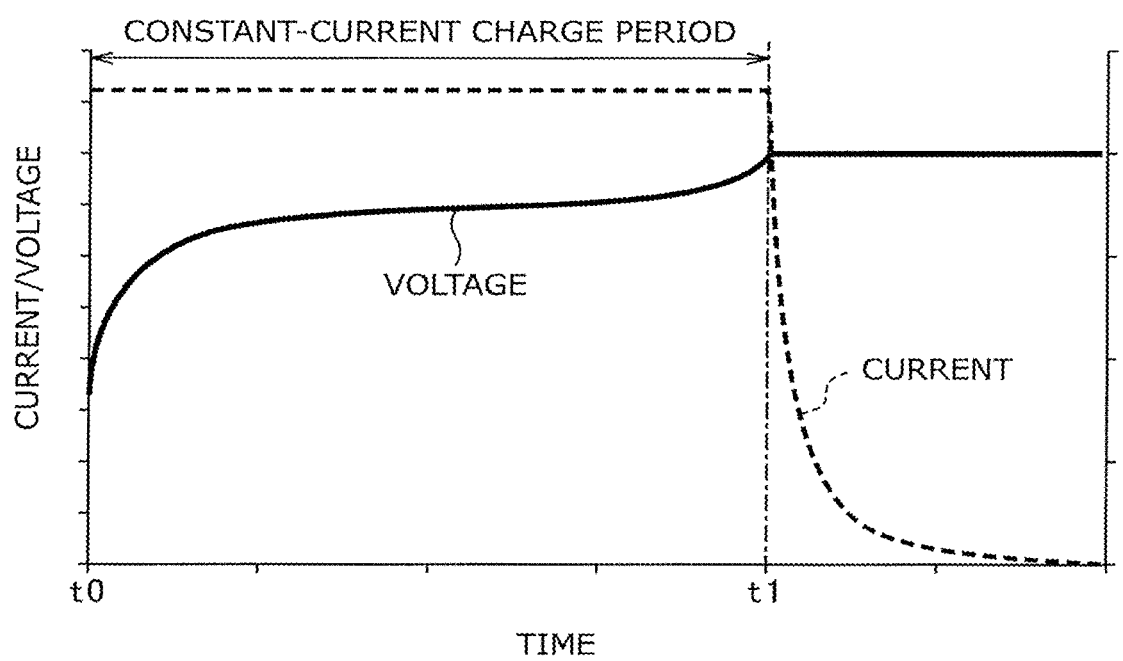
FIG. 3 illustrates an example of data regarding a current and a voltage during charge.

FIG. 3 illustrates an example of data regarding a current and a voltage during charge. The data illustrated in FIG. 3 is an example in constant-current constant-voltage charge, which is generally used as a charge method for secondary batteries. In FIG. 3, the broken line represents a current history and the solid line represents a voltage history.

In a process performed by the inner state parameter calculator 252, which is described later, the charge history of the whole constant-current constant-voltage charge may be used, or only the charge history of a constant-current charge period (t0 to t1 in FIG. 3) may be used, for example. Charge is not necessarily started when the SOC is 0%, and may be started when the SOC is 20%, for example.

The inner-state parameter calculator 252 calculates an amount of an active material forming the positive electrode or the negative electrode of a unit cell, an initial charge amount, the internal resistance of a unit cell, which are the inner state parameters, on the basis of the history recorded by the charge/discharge history recorder 251.

The inner-state parameter calculator 252 uses a function for calculating a storage battery voltage on the basis of an active material amount and an internal resistance. A storage battery voltage is calculated on the basis of the function, and current data and voltage data during charge/discharge of the storage battery. Then, an active material amount and an internal resistance which reduce a difference between a measured voltage and the calculated storage battery voltage are obtained through regression calculation. The positive electrode may be made from a plurality of active materials. However, in the present embodiment, an example of a secondary battery having a positive electrode and a negative electrode each made from one active material is explained.

When the secondary battery having a positive electrode and a negative electrode each made from one active material is charged, a voltage (a terminal voltage) "$V_t$" at time "t" is expressed by the following expression.

[Expression 1]

$$V_t = f_c\left(q_0^c + \frac{q_t}{M_c}\right) - f_a\left(q_0^a + \frac{q_t}{M_a}\right) + RI_t \quad (1)$$

"$I_t$" represents a current value at time "t", and represents a charge amount of the storage battery at time "t". "$f_c$" represents a function showing the relationship between the charge amount and the potential of the positive electrode, and "$f_a$" represents a function showing the relationship between the charge amount and the potential of the negative electrode. "$q_o^c$" represents the initial charge amount of the positive electrode, and "$M_c$" represents the mass of the positive electrode. "$q_o^a$" represents the initial charge amount of the negative electrode, and "$M_a$" represents the mass of the negative electrode. "R" represents the internal resistance.

As the current value "$I_t$", the current data recorded by the charge/discharge history recorder 251 is used. The charge amount $q_t$ is calculated by time-integrating the current value "$I_t$". The functions "$f_c$" and "$f_a$" are assumed to be stored as function information in the storage 24.

Five values (a parameter set), the initial charge amount "$q_o^c$" of the positive electrode, the mass "$M_c$" of the positive electrode, the initial charge amount "$q_o^a$" of the negative electrode, the mass "$M_a$" of the negative electrode, and the internal resistance "R" are estimated through regression calculation. The active material amount of each of the electrodes may be calculated by regarding the amount as a predetermined ratio of the mass of the electrode.

Figure 4:
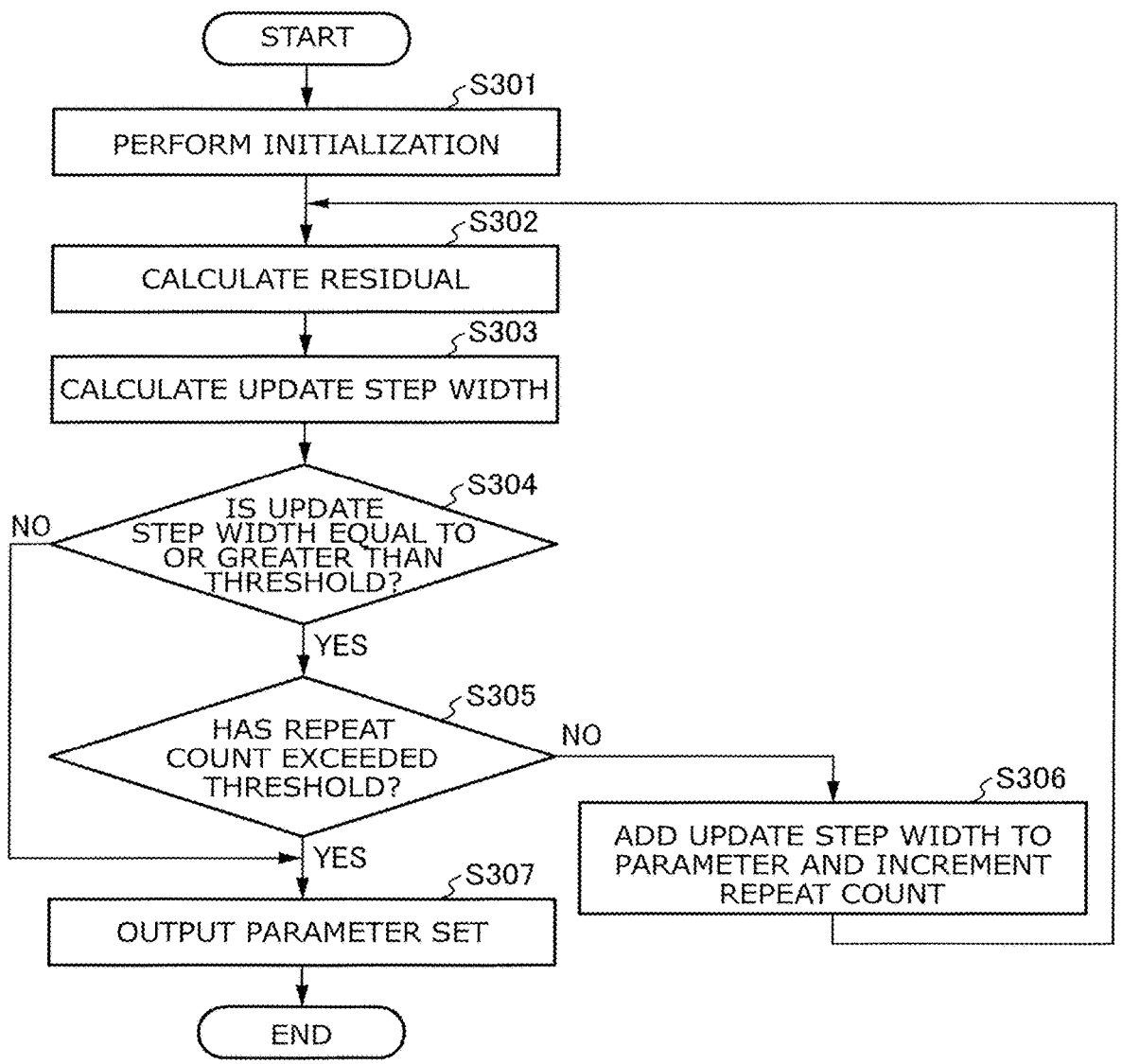
FIG. 4 illustrates an example of a flowchart of a process to be performed by an inner-state parameter calculator.

FIG. 4 illustrates an example of a flowchart of a process to be performed by the inner-state parameter calculator 252. The process to be performed by the inner-state parameter calculator 252 starts after completion of charge of the storage battery 1.

The inner-state parameter calculator 252 performs initialization to set initial values for the aforementioned parameter set and to set the repeat count of regression calculation to zero (S301). The initial value, for example, may be a value calculated when the previous process of calculating the active material amount, or may be an expectable value.

The inner-state parameter calculator 252 calculates a residual E which is expressed by the following expression (S302).

[Expression 2]

$$E = \sum_{t=0}^{t_{end}} (V_{bat\_t} - V_t)^2 \qquad (2)$$

$$= \sum_{t=0}^{t_{end}} \left( V_{bat\_t} - \left( f_c\left(q_0^c + \frac{q_t}{M_c}\right) - f_a\left(q_0^a + \frac{q_t}{M_a}\right) + RI_t \right) \right)^2$$

wherein "$V_{bat\_t}$" represents the terminal voltage at time "t", and "$t_{end}$" represents a charge end time.

The inner-state parameter calculator 252 calculates an update step width of the parameter set (S303). The update step width of the parameter set can be calculated by method, such as a Gauss-Newton method, a Levenberg-marquardt method.

The inner-state parameter calculator 252 determines whether the update step width is less than a predetermined width (S304). When the update step width is less than the predetermined width (No at S304), the inner-state parameter calculator 252 determines that the calculation has converged, and outputs the present parameter set (S307). When the update step width is equal to or greater than a predetermined threshold (Yes at S304), whether the repeat count of regression calculation is greater than a predetermined value is checked (S305).

When the repeat count of regression calculation is greater than the predetermined value (Yes at S305), the present parameter set is outputted (S307). When the repeat count of regression calculation is equal to or less than the predetermined value (No at S305), the update step width calculated at S303 is added to the parameter set and the repeat count of regression calculation is incremented by one (S306). Subsequently, the process returns to calculation of the residual (S302). The flowchart illustrating the flow of the process to be performed by the inner-state parameter calculator 252 has been described above.

In the present embodiment, a charge history is used as an input to the inner-state parameter calculator 252. However, a discharge history may be used to similarly calculate an active material amount. Also in the case where a discharge history is used, the process flow to be performed by the inner-state parameter calculator 252 and parameters to be used may be same as those in the case where a charge history is used to calculate the active material amount.

The battery characteristic calculator 253 calculates an open circuit voltage which is a battery characteristic of the storage battery 1. Further, the battery characteristic calculator 253 calculates the relationship between the charge amount of the storage battery and the open circuit voltage by using the initial charge amount "$q_o^c$" of the positive electrode, the mass "$M_c$" of the positive electrode, the initial charge amount "$q_o^a$" of the negative electrode, and the mass "$M_a$" of the negative electrode calculated by the inner-state parameter calculator 252.

Figure 5:
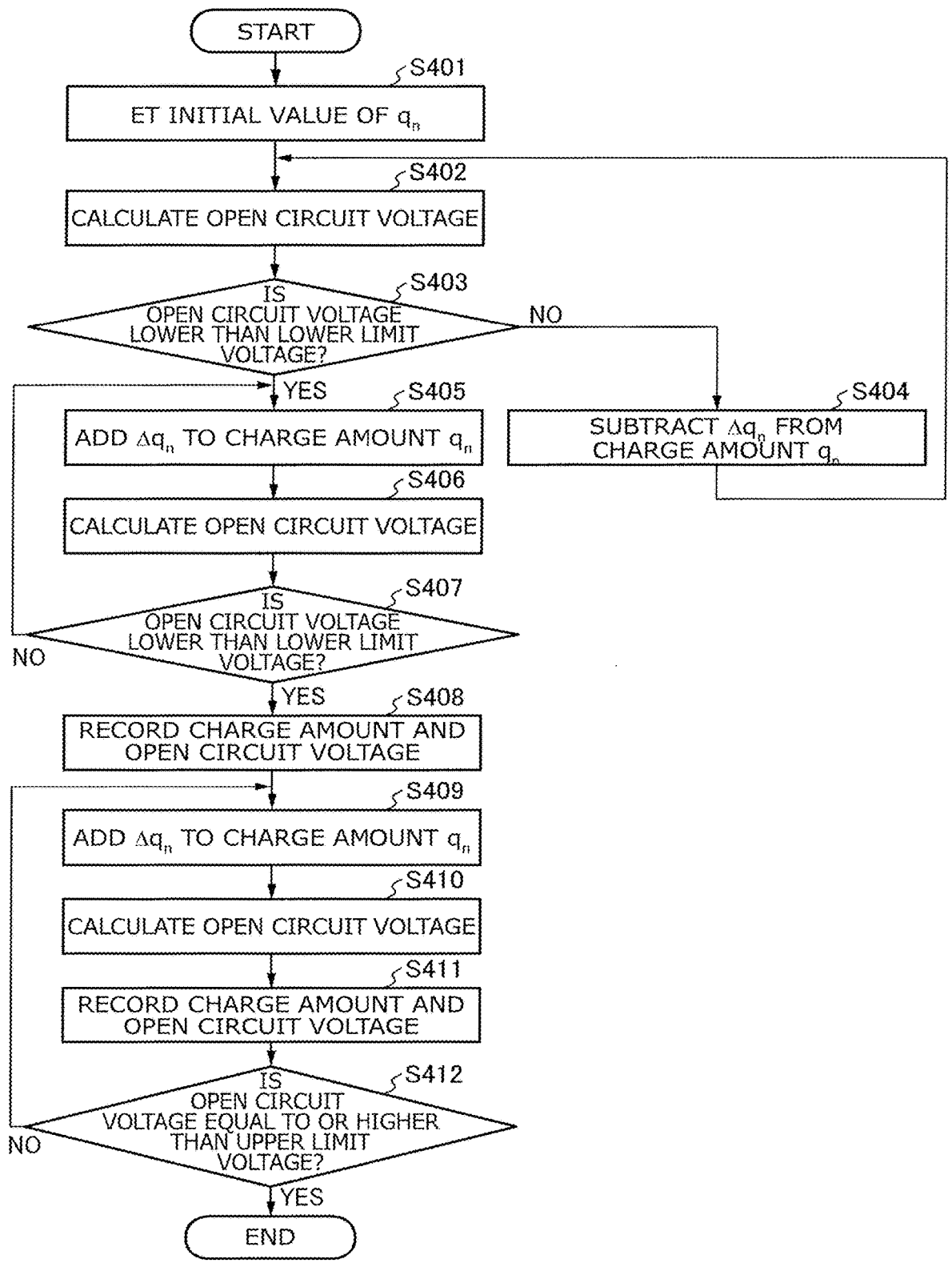
FIG. 5 illustrates an example of a flowchart of a process flow to be performed by a battery characteristic calculator.

FIG. 5 illustrates an example of a flowchart of a process flow to be performed by the battery characteristic calculator 253. The flowchart starts after the process performed by the inner-state parameter calculator 252 is ended. In this flowchart, the charge amount $q_n$ is increased and decreased by a predetermined value $\Delta q_n$, the charge amount $q_{n0}$ is found at which the open circuit voltage exceeds the lower limit, and $q_n$ is increased by $\Delta q_n$ from $q_{n0}$ as an initial value until the open circuit voltage exceeds the upper limit, and the charge amount and the open circuit voltage are recorded every time the increase is performed. Accordingly, the relationship between the charge amount and the open circuit voltage in a range from the lower limit to the upper limit of the open circuit voltage can be calculated. The difference between the charge amount $q_{n0}$ and the charge amount $q_n$ at which the open circuit voltage is the upper limit is a battery capacity.

The battery characteristic calculator 253 sets the initial value of the charge amount $q_n$ (S401). The initial value of $q_n$ may be set to zero or to a value which is less than zero by a few percent of the nominal capacity of the storage battery 1. Specifically, if the nominal capacity of the storage battery 1 is 1000 mAh, the initial value of $q_n$ may be set within a range of approximately −50 mAh to 0 mAh.

The battery characteristic calculator 253 calculates the open circuit voltage (S402). To calculate the open circuit voltage, the following expression can be used.

[Expression 3]

$$E_n = f_c\left(q_0^c + \frac{q_n}{M_c}\right) - f_a\left(q_0^a + \frac{q_n}{M_a}\right) \qquad (3)$$

Next, the battery characteristic calculator 253 compares the calculated open circuit voltage with a predetermined storage battery lower limit voltage (S403). The storage battery lower limit voltage is defined on the basis of combination of the positive electrode active material and the negative electrode active material used in the storage battery 1. Specifically, in terms of each of the safety, the lifetime, the resistance, or the like, the appropriate usage ranges of the voltage for the positive electrode active material and the negative electrode active material are defined, and the combination of the ranges is used to determine the lower limit and the upper limit of the usage range for the storage battery.

When the open circuit voltage is not less than the predetermined lower limit voltage (No at S403), $\Delta q_n$ is subtracted from the charge amount $q_n$ (S404) and the open circuit voltage is calculated again (S402). When the open circuit voltage is less than the predetermined lower limit voltage (Yes at S403), the battery characteristic calculator 253 adds $\Delta q_n$ to the charge amount $q_n$ (S405). In this way, the charge amount $q_n$ approximates to the lower limit value. A value of $\Delta q_n$ can be freely determined. For example, $\Delta q_n$ may be set to approximately 1/1000 to 1/100 of the nominal capacity of the storage battery 1. Specifically, if the nominal capacity of the storage battery 1 is 1000 mAh, $\Delta q_n$ may be set to a range of approximately 1 mAh to 10 mAh.

The battery characteristic calculator 253 calculates the open circuit voltage by using the added charge amount $q_n+\Delta q_n$ (S406). Subsequently, the battery characteristic calculator 253 compares the calculated open circuit voltage with the aforementioned lower limit voltage (S407). When the open circuit voltage is lower than the lower limit voltage (No at S407), the process returns to S405 and $\Delta q_n$ is added to the charge amount $q_n$ again (S405). When the open circuit voltage is equal to or higher than the lower limit voltage (Yes at S407), the charge amount $q_n$ at that time is set to $q_{n0}$ because the open circuit voltage has exceeded the lower limit value, and the charge amount $q_{n0}$ and the open circuit voltage En are recorded together (S408). The value of the charge amount $q_{n0}$ may be set as a reference value and expressed by "0". In this case, the value obtained by subtracting the value of $q_{n0}$ from the value of the charge amount $q_n$, in subsequent recording.

The battery characteristic calculator 253 adds $\Delta q_n$ to the charge amount $q_n$ (S409), calculates the open circuit voltage (S410), and records the calculated open circuit voltage En and the value obtained by subtracting $q_n$ from the charge amount $q_n$ (S411).

The battery characteristic calculator 253 compares the calculated open circuit voltage with the predetermined upper limit voltage of the storage battery (S412). The upper limit voltage of the storage battery is defined on the basis of combination of the positive electrode active material and the negative electrode active material used in the storage battery 1. When the open circuit voltage is lower than the predetermined upper limit voltage (No at S412), the process returns to adding of $\Delta q_n$ to the charge amount again (S409). When the open circuit voltage is equal to or higher than the predetermined upper limit voltage (Yes at S412), the process is ended. The flowchart illustrating the process flow to be performed by the battery characteristic calculator 253 has been described.

Figure 6A:
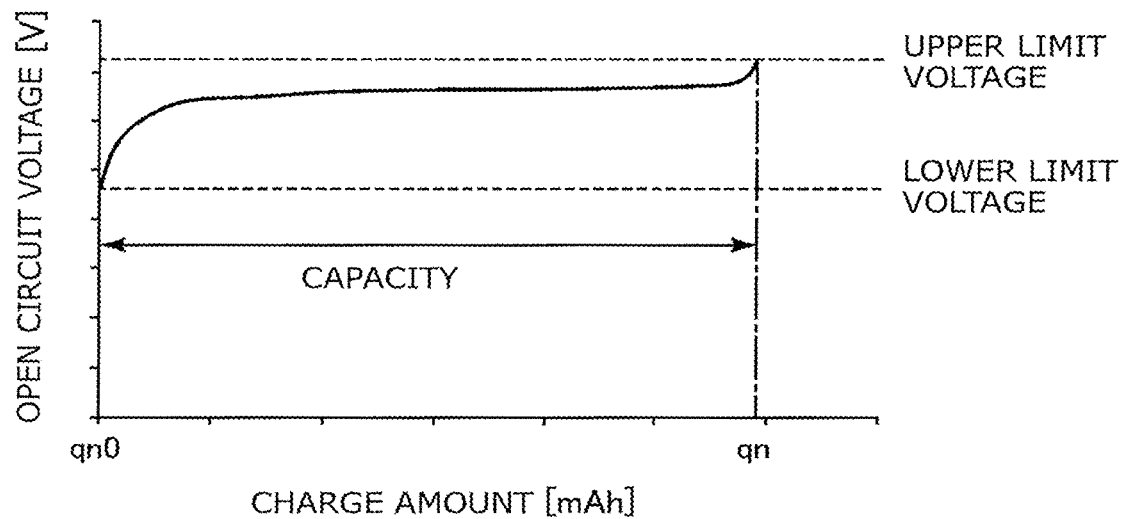
FIGS. 6A and 6B illustrate an example of graphs (charge amount-OCV curves) illustrating the relationships between a charge amount and an open circuit voltage.
Figure 6B:
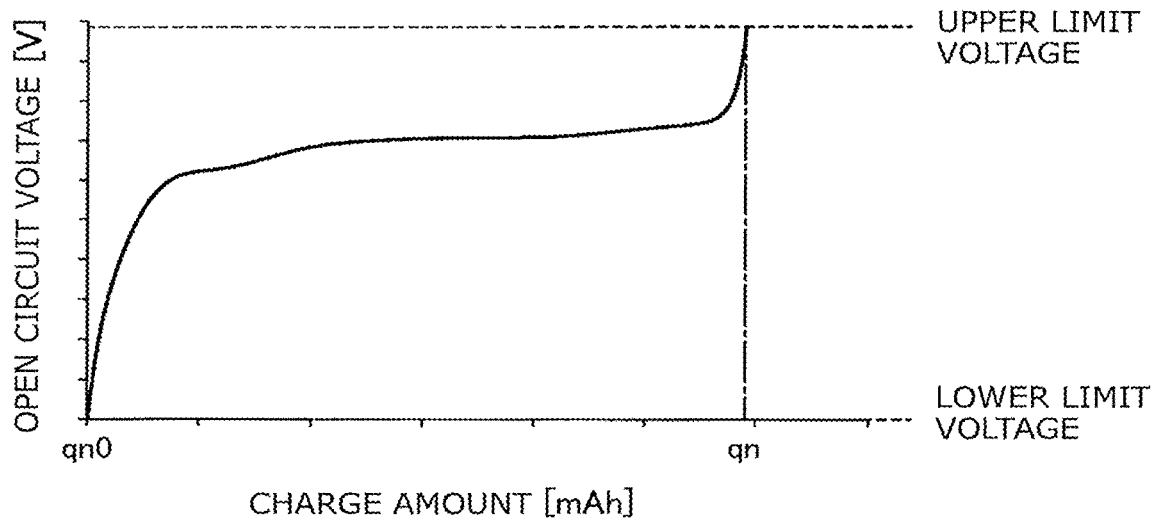

FIGS. 6A and 6B illustrate an example of graphs (charge amount-OCV curves) illustrating the relationships between a charge amount and an open circuit voltage. FIG. 6A illustrates a charge amount-OCV curve at the present state obtained by the battery characteristic calculator 253. FIG. 6B is a diagram obtained by taking out a range from the lower limit voltage to the upper limit voltage of the ordinate, from the graph illustrated in FIG. 6A.

Figure 7:
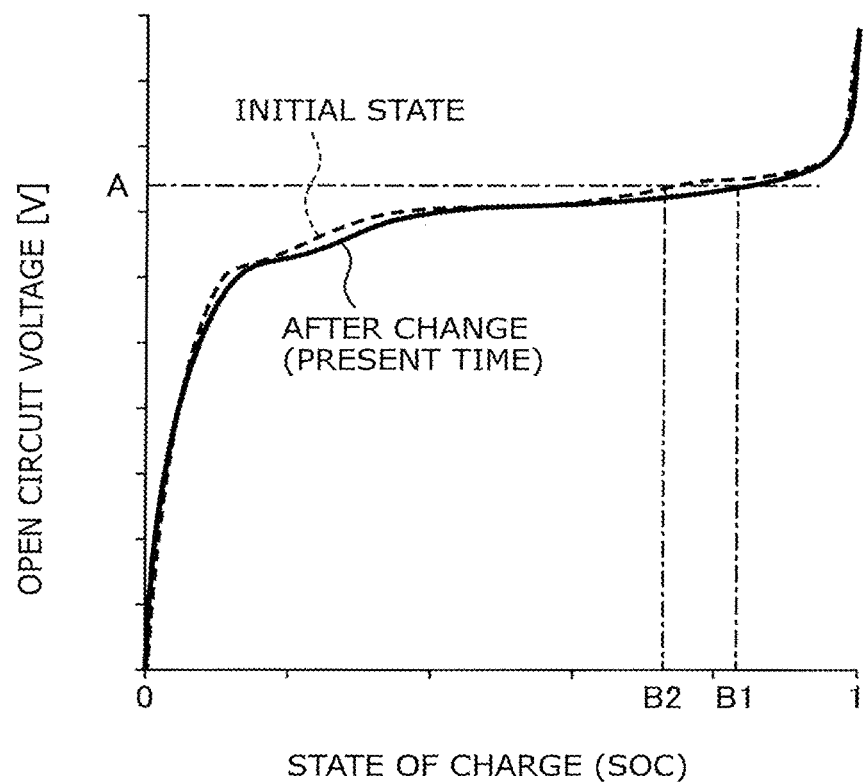
FIG. 7 illustrates an example of a graph (an SOC-OCV curve) illustrating the relationship between an SOC and an open circuit voltage.

FIG. 7 illustrates an example of a graph (an SOC-OCV curve) illustrating the relationship between an SOC and an open circuit voltage. FIG. 7 differs from FIGS. 6A and 6B in that the abscissa in FIG. 7 indicates not the charge amount but the SOC. In FIG. 7, a graph (a solid line) obtained by converting the graph illustrated in FIG. 6B into a SOC-OCV curve and the SOC-OCV curve (a broken line) of the storage battery at the initial state are overlapped. In FIG. 7, the broken line represents the open circuit voltage of the storage battery at the initial state, and the solid line represents the open circuit voltage of the storage battery after change (present time) due to deterioration of the storage battery or the like. The SOC indicates the ratio of the present charge amount with respect to the full charge capacity, and is expressed by a value from 0 to 1, or 0 to 100%.

The charge amount may be converted into an SOC by using the battery capacity and the charge amount calculated from the charge amount-OCV curve. In the description herein, the simple term "charge state" includes not only the SOC but also the charge amount and the like.

The length of the curve after change becomes shorter as the capacity decreases. However, FIG. 7 illustrates that not only the length but also the shape of the curve changes. For example, in the case where the state of charge (SOC) is estimated on the basis of the open circuit voltage, when the measured open circuit voltage is A, the normal charge state (the present state of charge) is B1. However, if the curve of the open circuit voltage is considered not to change, that is, if the open circuit voltage is to be obtained from the SOC-OCV curve at the initial state, B2 is obtained as the charge state at the voltage A, and thus, efficiency in estimation of the charge state is deteriorated. Therefore, as a result of using the SOC-OCV curve at the present state, as in the first embodiment, the charge state can be measured with high accuracy.

The SOC-OCV curve calculated by the battery characteristic estimator 25 may be acquired by the SOC estimator 23 such that the SOC estimator 23 estimates the SOC of the storage battery 1 on the basis of the SOC-OCV curve.

Therefore, according to the first embodiment, it is possible to accurately grasp the relationship (the charge amount-OCV curve or the SOC-OCV curve) which changes with use between the charge amount and the open circuit voltage, without performing special charge and discharge, and thus, the charge state can be highly accurately estimated.

The case where the positive electrode and the negative electrode of the secondary battery are each formed from one kind of an active material has been described herein. However, the present invention can be similarly applied to a secondary battery in which any of the positive electrode and the negative electrode thereof is formed from a plurality of kinds of active materials. Further, in the case where a different storage for storing the active material amounts of the storage battery 1 is prepared in advance, the battery characteristic calculator 253 can calculate a graph showing the relationship between the charge amount and the open circuit voltage of the secondary battery within a predetermined voltage range of the storage battery, by using the active material amounts stored in the different storage.

The battery characteristic calculator 253 may further calculate other battery characteristics. For example, the battery characteristic calculator 253 may calculate the voltage, the power, and the power amount of the storage battery 1 by using the calculated open circuit voltage or the like. As the calculation method, for example, calculation expressions below may be used. In the following calculation expressions, "c" represents a predetermined constant.

$$\text{voltage} = \text{open circuit voltage} - c \times \text{internal resistance} \times \text{current} \quad \text{(Voltage)}$$

$$\text{power} = \text{current} \times \text{open circuit voltage} - c \times \text{internal resistance} \times (\text{current})^2 \quad \text{(Power)}$$

$$\text{power amount} = \text{battery capacity} \times \text{average voltage} \quad \text{(Power amount)}$$

As the internal resistance, an estimated value calculated by the inner-state parameter calculator 252 may be used, or an estimated value corrected by the internal-resistance corrector 26 may be used. The internal-resistance corrector 26 will be described later. The battery characteristic calculator 253 may recalculate a battery characteristic, which has been calculated, by using the estimation value corrected by the internal-resistance corrector 26. The estimation value corrected by the internal-resistance corrector 26 can further improve the accuracy. The current may be acquired from data measured by the measurer 22. The battery characteristic calculator 253 may receive an expression, a constant value, or the like necessary for the calculation, via the storage 24 or the like.

The internal-resistance corrector 26 corrects, on the basis of a temperature T measured by the measurer 22, the internal resistance R calculated by the battery characteristic estimator 25 to the internal resistance of the storage battery 1 at the present temperature T. The corrected internal resistance is defined as Rcr. In a case where the internal resistance is not corrected, the internal-resistance corrector 26 can be omitted.

Temperature correction of the internal resistance is performed by the internal-resistance corrector 26, will be described. The temperature correction of the internal resistance provides, for example, correction of influence of the temperature with respect to a storage battery performance diagnosis method, and expands a temperature range within which storage battery performance diagnosis can be excellently applied. In the storage battery performance diagnosis method, the battery capacity, the internal resistance, and the degree of degradation of each of the active materials of each of the positive and negative electrodes are estimated from the charge and discharge curve by reference to the charge amount-OCV data of each of the active materials as described in the process of the battery characteristic estimator 25.

The principle and method of the temperature correction are described. Lithium-ion secondary batteries each include a positive electrode and a negative electrode opposite to each other, and an electrolyte containing a Li salt between the positive and negative electrodes. Active materials are applied onto current collecting foils of the positive and negative electrodes. The current collecting foils are connected to the positive electrode and negative electrode terminals on the storage battery exterior. During charge and discharge of the storage battery, Li ions move between the positive electrode active material and the negative electrode active material via the electrolyte so that electrons flow from the active materials to external terminals.

Each of the active materials has a unique potential and a unique amount of Li which can be reversibly inserted or desorbed. An energy quantity which the storage battery can store in a range of a fixed charge and discharge voltage is determined by the amounts of the positive electrode active material and the negative electrode active material in the storage battery and combination thereof.

Further, at the time of charge and discharge, there are caused Li ion conduction, charge transfer resistance due to Li ions in the electrolyte penetrating into the active material, resistance of a film formed on the interface between the electrolyte and the active material, and electrical resistance due to electrons flowing through the active material and the current collection foil. The internal resistance of the battery is the sum total of the Li ion transfer resistance, the electron transfer resistance, the charge transfer resistance, the film resistance, and the diffused resistor in the positive electrode and the negative electrode.

Generally, in a storage battery control system in a lithium ion secondary battery, the voltage of each of the unit cells, the temperature in the battery pack, and the like, are measured in the viewpoint of safety. If the battery characteristics can be calculated on the basis of such measurement data, cost and time required for calculation can be suppressed.

However, it is very difficult to analyze the behavior of the storage battery during actual use in which a charge and discharge condition finely and randomly varies. The reason for this is that since such a behavior is a phenomenon in which a resistance depending on time, a diffusion resistance, a relaxation process, and the like are complexed in a complicated way, a calculation model therefor is difficult to obtain. In contrast, for example, if only a simply behavior such as charge of an electric vehicle under a predetermined condition is analyzed, the analysis can be performed using a simplified model.

Therefore, in the storage battery performance estimating method according to the present embodiment, values of variables are determined by fitting calculation using, as variables, the amount of each of the active materials, the rise (overvoltage) of the storage battery voltage due to internal resistance at application of charge current, on the basis of an "electric potential-charge amount" curve associated with the Li insertion-elimination reaction of each active material, which is obtained by data (charge-discharge curve) of charge or discharge under fixed conditions. Thereby, it is possible to estimate the capacity reduction (reduction of each active material) and the increase in internal resistance.

Figure 8:
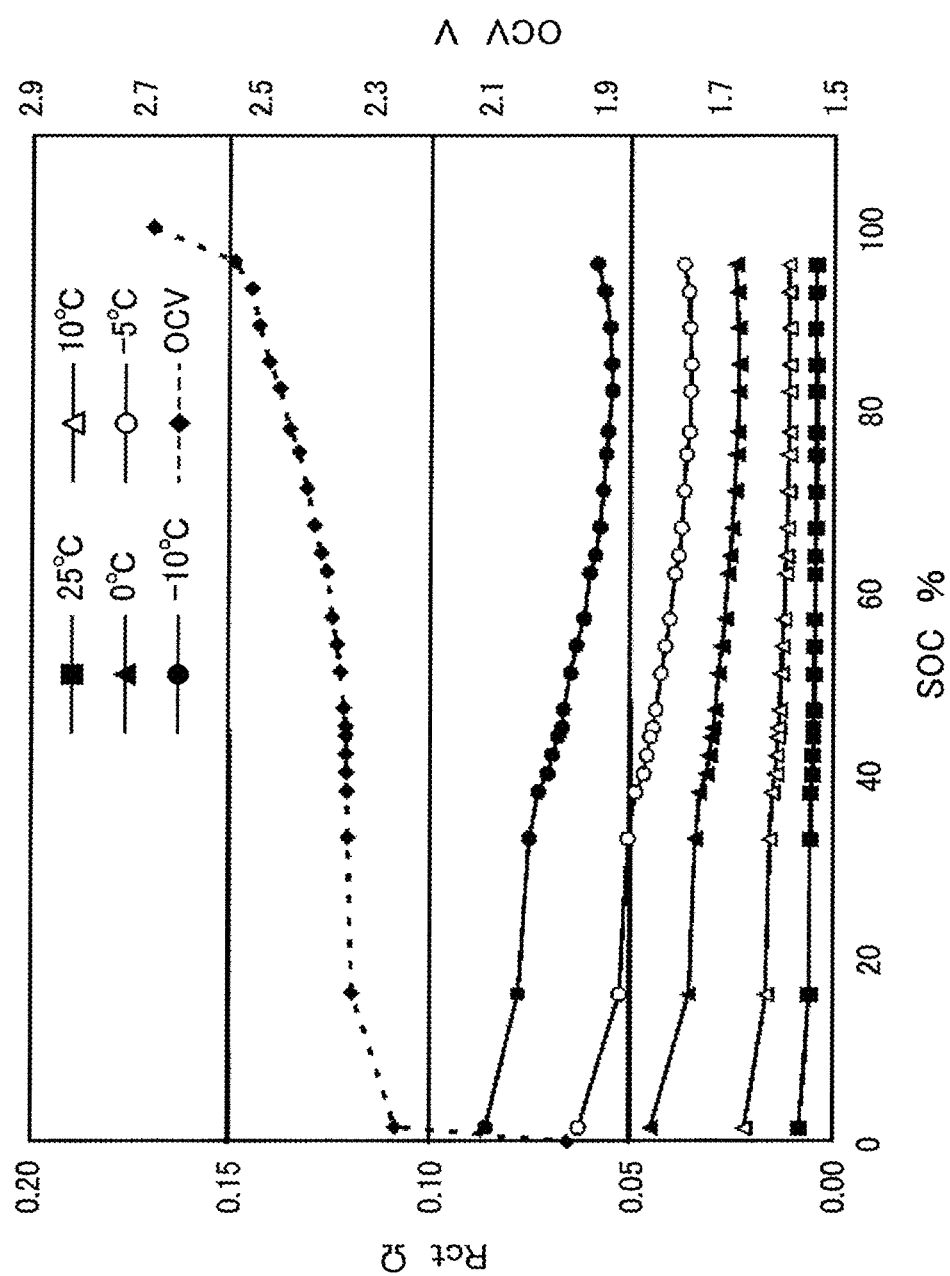
FIG. 8 illustrates an example of the relationships, at respective temperatures, between SOCs and reaction resistances Rct.

However, under an actual use situation of a storage battery, a temperature condition varies according to an external environment, the state of the storage battery during charge and the like. When the temperature of the storage battery changes, the performance of the storage battery changes. In particular, the internal resistance increases greatly depending on reduction in temperature. FIG. 8 illustrates an example of the relationships, at respective temperatures, between SOCs and reaction resistances Rct. A reaction resistance Rct is one of internal resistance components. As illustrated in FIG. 8, reaction resistances differ greatly according to difference in temperature. Accordingly, even if the analysis results of measurement data of different temperatures are compared with one another, it is difficult to evaluate the increase in internal resistance due to deterioration because the results are greatly influenced by variation in analysis result caused by temperatures.

Accordingly, when the battery characteristics are estimated on the basis of measurement data about the storage battery actually being used, performing temperature correction on the internal resistance improves accuracy of estimating the battery characteristics.

Internal resistances of the storage battery are composed of a plurality of types of resistance components. The resistance components differ from one another in temperature dependency and increase speed due to deterioration. For this reason, with progress of deterioration, the ratio of the resistance changes, and accordingly, the temperature dependency of the internal resistance as a whole also changes. In view of this point, in temperature correction of internal resistances in the storage battery performance estimating method according to the present embodiment, internal resistances are divided into three components, which are a reaction resistance "Rct", a diffusion resistance "Rd", and an ohmic resistance "Rohm". The components are corrected to values corresponding to a reference temperature "T0", in accordance with the respective unique temperature dependencies, and then, are summed up.

Specifically, the storage battery temperature at the time of measurement is corrected to the reference temperature by mathematical expressions below. In the expressions below, "Rgas" represents a gas constant, "T0" represents the reference temperature, T represents the storage battery temperature at the time of measurement, "R1" represents a constant, and "Ea", "Eb", and "Ec" each represent a constant for determining the temperature dependency of the corresponding resistance component.

$$Rct(T0)=Rct(T) \times \mathrm{Exp}(-Ea/(Rgas \cdot T))/\mathrm{Exp}(-Ea/(Rgas \cdot T0)) \quad \text{(Reaction resistance)}$$

$$Rd(T0)=Rd(T) \times \mathrm{Exp}(-Eb/(Rgas \cdot T))/\mathrm{Exp}(-Eb/(Rgas \cdot T0)) \quad \text{(Diffusion resistance)}$$

$$Rohm(T0)=(Rohm(T)-R1) \times \mathrm{Exp}(-Ec/(Rgas \cdot T))/\mathrm{Exp}(-Ec/(Rgas \cdot T0))+R1 \quad \text{(Ohmic resistance)}$$

Figure 9:
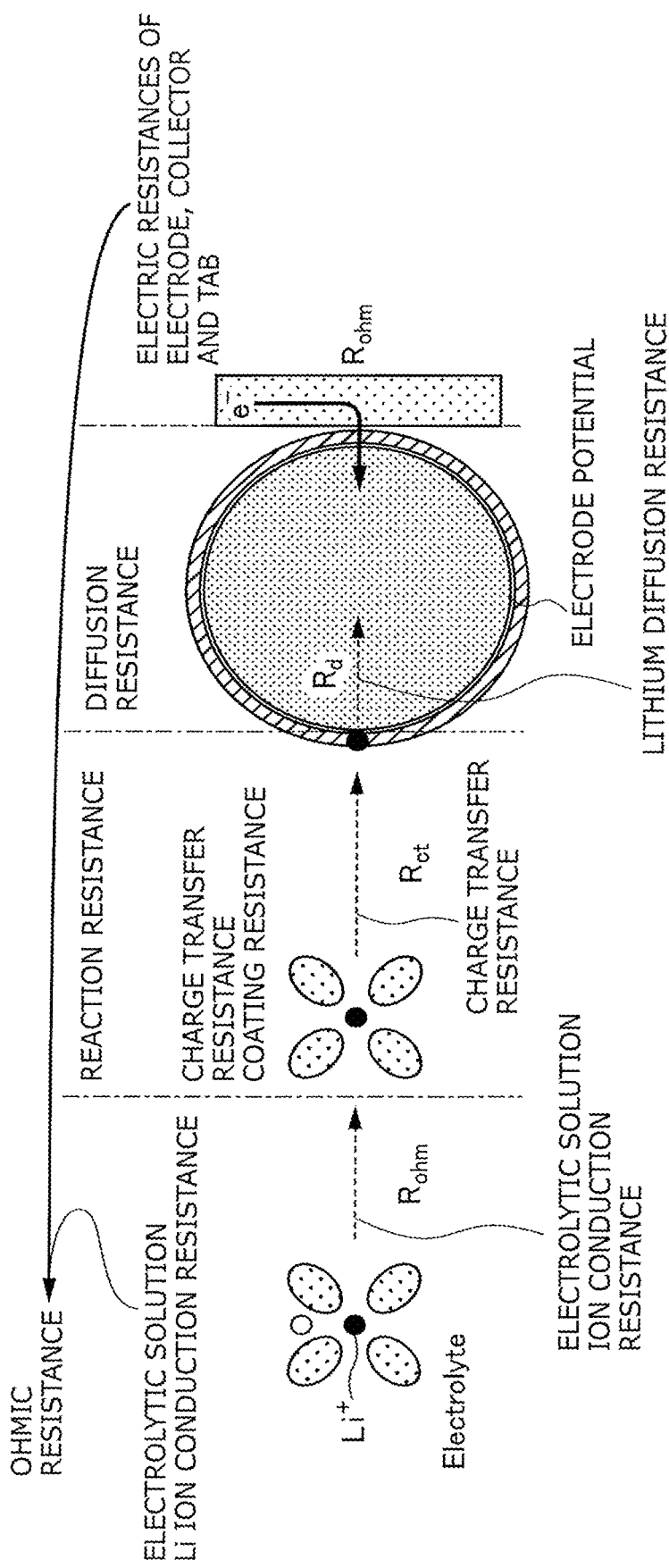
FIG. 9 is a diagram regarding resistive components.

FIG. 9 is a diagram regarding the resistance components. The ohmic resistances include an ion conduction resistance in an electrolyte and an electron conduction resistance in the storage battery. The electron conduction resistance which has a low temperature dependency is a constant. The reaction resistances include a charge transfer resistance and the resistance of a surface coating. The diffusion resistances include resistances associated with diffusion of lithium ions inside the active materials and the electrodes.

"Ec" of the ohmic resistance represents an active energy associated with transfer of Li ions in the electrolyte. "Ea" of the reaction resistance represents an energy generated when Li ions solvated in the electrolyte are removed on an active material surface. "Eb" of the diffusion resistance is considered as an active energy associated with transfer of Li ions between sites in an active material. Accordingly, the above values can be considered as constant values which are not changed in the deterioration process.

The values "Ea", "Eb", and "Ec" can be calculated by measuring the AC impedances, or the current pulses of unit cells, for example. The values "Ea", "Eb", and "Ec" about the storage battery to be analyzed are calculated from measurement values, and stored in the storage 24, in advance. The values may be referred in temperature correction calculation of the internal resistances.

A method of estimating the battery characteristics from the charge and discharge curve by dividing the internal resistances into three types of components is described.

In the deterioration process of the storage battery, all of the three components of the internal resistances increase, but the increase speeds due to the deterioration differ from one another. Accordingly, the assumption that deterioration does not occur may be established as a result of limiting the lifetime range of the storage battery to be evaluated. For example, in a storage battery for electric vehicles for which the evaluation lower limit is assumed to be the residual capacity of approximately 90 to 70%, some of the resistance components can be approximated to a fixed value throughout the storage battery lifetime, although the use condition, the configuration of the storage battery, and the like can have some influences.

(First Method)

In a first method for calculating the three components from the calculated internal resistance values of the storage battery, the ohmic resistance component and the diffusion resistance component are considered to be fixed, and the residual is considered as the reaction resistance. This method assumes that deterioration does not cause increase in the ohmic resistance component and the diffusion resistance component, and considers only temperature change which depends on a cell temperature. In analysis of a charge and discharge curve, the ohmic resistance component and the diffusion resistance component at the temperature T are subtracted from the internal resistance value estimated for the temperature T, and the remainder is regarded as the reaction resistance component. The components are subjected to temperature correction to the reference temperature T0, and summed up, so that the internal resistance values at the reference temperature T0 are calculated. The first method is suitable for moderate usage, in which, for example, the SOC falls within a range in which the active materials of the positive and negative electrodes are stable, the temperature is equal to or lower than the approximate room temperature, and the current of the storage battery is relatively small.

(Second Method)

In a second method, the ohmic resistance component and the diffusion resistance component are estimated by a function regarding the relationship between the two resistance components and an accumulated time or accumulated power amount, and the residual is regarded as the reaction resistance. This method calculates the ohmic resistance component and the diffusion resistance component, while assuming that deterioration in the ohmic resistance component and the diffusion resistance component correlates with a time or a cycle amount of charge and discharge. In analysis of a charge and discharge curve, the calculated ohmic resistance component and the calculated diffusion resistance component are subtracted from the internal resistance value estimated for the certain temperature T, and the remainder is regarded as the reaction resistance component. The components are subjected to temperature correction to the reference temperature T0, and summed up, so that the internal resistance values at the reference temperature T0 are calculated. The second method is suitable for a case where deterioration in the ohmic resistance component and the diffusion resistance component is relatively small, but actually progresses.

Which of an accumulated time and an accumulated power amount is used may be determined according to the use environment or the like. For example, for a case where deterioration of the storage battery progresses due to generation of gas during preservation, deterioration amount estimation using an accumulated time is suitable. In contrast, for a case where deterioration of the storage battery, such as change in volume of the active materials, is remarkable due to repetition of a process cycle such as charge and discharge, deterioration amount estimation using an accumulated power amount is suitable.

Data on an accumulated time or an accumulated power amount is assumed to be held in advance. The accumulated power amount may be replaced with an operation amount of a device, such as the travel distance of a vehicle, for example.

(Third Method)

In a third method, a reaction resistance component and a diffusion resistance component are estimated from data on the diffusion resistances and the charge amounts of the respective materials which are held in advance or data on the reaction resistances and the charge amounts of the respective materials which are held in advance, and the residual is regarded as an ohmic resistance component. In the third method, unlike the first and second methods, the values of the reaction resistance and the diffusion resistance are estimated by performing regression calculation, in analysis of the charge and discharge curve, with reference to the reaction resistance-charge amount curve of an active material, the diffusion resistance-charge amount curve of an active material, or the internal resistance-charge amount curve of the storage battery. By using the fact that the resistance component of an active material has a dependency on the charge amount, that is, the SOC, and that the tendency of the dependency does not change even after deterioration, the compositions of the internal resistance are estimated from the tendency of internal resistance-charge amount of the storage battery.

A reaction resistance-charge amount curve and a diffusion resistance-charge amount curve of an active material need to be measured in advance. The form of change due to deterioration, which depends on the configuration of the storage battery, needs to be measured in advance. For example, it is considered that, when a resistive surface film is formed, the resistance is uniformly increased by a constant value according to the formation of the film, and that, when the active material is decreased, the resistance is uniformly increased by n-times according to the decrease.

The third method is suitable for a case where the reaction resistance-charge amount remarkably changes, and as a result, the reaction resistances of the storage battery clearly have a dependency on the charge amount.

(Fourth Method)

In a fourth method, regression calculation is performed using data of each active material which is held in advance and is on the diffusion resistance-charge amount, the reaction resistance-charge amount, and the ohmic resistance-charge amount, so that the reaction resistance component, the ohmic resistance component, and the diffusion resistance component are estimated. In the third method, only the diffusion resistance-charge amount and the reaction resistance-charge amount are used. However, in the fourth method, data on the ohmic resistance-charge amount is further used. The fourth method is effective for a case where the dependency of an active material on the ohmic resistance-charge amount is characteristic, for example, a case where the electron conductivity of the active material greatly changes due to charge or discharge.

The battery characteristic calculator 253 may calculate, as the battery characteristics, the power amount or the like which can be actually outputted by using the corrected internal resistances. The power amount which can be actually outputted can be calculated on the basis of the charge amount-OCV curve, the dischargeable power amount, and the corrected internal resistances.

The condition-of-use creator 27 calculates a condition of use on the basis of the deterioration information and the estimation values of the inner state parameters or the battery characteristics of the storage battery 1. It is herein assumed that the condition of use is calculated such that the deterioration speed of the storage battery 1 is not more than a specified value (target value).

The speed of deterioration represents a speed at which deterioration of the secondary battery progresses. The specified value of the speed of deterioration may be stored in the deterioration information storage 271 in advance, or may be received from a user or the like via an input device (not illustrated).

The deterioration information storage 271 stores therein information (data) regarding deterioration of the secondary battery, which is required for the charge/discharge control apparatus 2 to calculate a condition of use for the storage battery 1. Hereinafter, such information is referred to as deterioration information. Deterioration information can be regarded as reference data for a graph or a function to be referred in calculation of a condition of use. The deterioration information may be reference data, for example, at least indicating relationship between the deterioration speed of a secondary battery and one or more reference parameters regarding the secondary battery. Notably, the deterioration information at least includes a deterioration model or a deterioration map. The deterioration model or the deterioration map will be described later.

The deterioration information storage 271 may store information other than deterioration information. For example, the deterioration information storage 271 may store a constraint condition to be used in a process performed by the condition-of-use creator 27. The deterioration information storage 271 may store a created condition of use. The deterioration information storage 271 may be identical to the storage 24.

The deterioration information acquirer 272 acquires, from the battery characteristic estimator 25, an estimation value according to at least any of the inner state parameters and the battery characteristics. Then, the deterioration information acquirer 272 acquires deterioration information (first reference data) corresponding to the storage battery 1 from the deterioration information storage 271 on the basis of the acquired estimation value. In other words, the deterioration information acquirer 272 extracts the deterioration information corresponding to the storage battery 1 out of the deterioration information of the secondary battery.

Notably, the deterioration information acquirer 272 may acquire deterioration information (second reference data) corresponding to the positive electrode on the basis of the estimation value regarding the positive electrode. For example, the deterioration information corresponding to the positive electrode may be information at least indicating relationship between the deterioration speed of the positive electrode and one or more reference parameters. Moreover, the deterioration information acquirer 272 may acquire deterioration information (third reference data) corresponding to the negative electrode on the basis of the estimation value regarding the negative electrode. For example, the deterioration information corresponding to the negative electrode may be information at least indicating relationship between the deterioration speed of the negative electrode and one or more reference parameters. For example, deterioration information may be acquired on the basis of an initial charge amount of the positive electrode or negative electrode calculated as an inner state parameter. For example, deterioration information may be acquired on the basis of the mass of the positive electrode or the negative electrode calculated as an inner state parameter. For example, deterioration information may be acquired on the basis of an open circuit voltage calculated as a battery characteristic.

When the estimation value of the storage battery 1 satisfies the prerequisite condition of a secondary battery for creating in advance deterioration information, the deterioration information is considered to correspond to the storage battery 1. For example, in the case where deterioration information is created on the basis of a plurality of secondary batteries satisfying a prerequisite condition that the active material amount of the positive electrode is within a predetermined range, when the estimation value on the active material amount of the positive electrode of the storage battery 1 is within the predetermined range, the deterioration information can be regarded as corresponding to the storage battery 1. Moreover, the deterioration information corresponding to the storage battery 1 can be regarded as deterioration information suitable for creating the condition of use of the storage battery 1.

The deterioration information acquirer 272 may acquire deterioration information on the basis of a plurality of estimation values. Deterioration information matching a plurality of estimation values is highly possibly deterioration information more matching the storage battery 1 than deterioration information matching one estimation value. Therefore, in the case of using the deterioration information matching a plurality of estimation values, the accuracy of the calculated condition of use is considered to be improved more than in the case of using the deterioration information matching one estimation value.

The condition-of-use calculator 273 calculates a condition of use of the storage battery 1 on the basis of the deterioration information (first reference data) which is acquired by the deterioration information acquirer 272 and is set to correspond to the storage battery 1 and a specified value of the deterioration speed. Notably, the calculated condition of use becomes a condition regarding at least one of reference parameters. Herein, a method of calculating a condition of use for the deterioration speed being not more than the specified value using a deterioration model or a deterioration map is described.

First, a deterioration model is described. FIG. 10A to 10D are graphs each illustrating a deterioration model. FIG. 10A to 10D each illustrate an example of a deterioration speed calculation graph for calculating a deterioration speed. A deterioration speed calculation graph illustrates the relationship between parameters about the secondary battery and the deterioration speed. Hereinafter, the parameters about the secondary battery are referred to as reference parameters.

A deterioration model shows how deterioration of a secondary battery progresses, and, for example, refers to a whole deterioration speed calculation graph. A deterioration speed calculation graph is calculated on the basis of the result of an inspection of a plurality of secondary battery. Therefore, the deterioration speed calculation graph can be generally used for secondary batteries of the same type. In other words, the deterioration speed calculation graph used for estimation on the storage battery 1 is created on the basis of secondary batteries of the same type as that of the storage battery 1. The present embodiment assumes that a deterioration speed calculation graph is calculated in advance, and is stored in the deterioration information storage 271.

A deterioration speed calculation graph is derived from the inspection result of a plurality of secondary batteries satisfying a certain prerequisite condition. The prerequisite condition is not limited to a particular condition, and various prerequisite conditions are assumed. For example, the prerequisite condition requires the active material amount in the positive electrode of a unit cell to fall within a predetermined range. A plurality of secondary batteries satisfying the prerequisite condition are inspected, and a deterioration speed calculation graph is calculated on the basis of the inspection result. At that time, the inner state parameters are estimated from the inspection result, and a deterioration model of the positive electrode and a deterioration model of the negative electrode can be obtained on the basis of change in the active material amount of the positive electrode and change in the active material amount of the negative electrode, respectively. When the active material amount in the positive electrode of the storage battery 1 falls within the predetermined range, that is, when the storage battery 1 satisfies the prerequisite condition, the deterioration speed of the storage battery 1 can be estimated from the deterioration speed calculation graph calculated on the basis of the prerequisite condition. A method for creating the deterioration speed calculation graph is not limited to a particular method, and may be freely determined.

Other than the above, for example, a matter regarding a preservation or use environment of a secondary battery may be regarded as a prerequisite condition. As a prerequisite condition regarding the environment, the temperature, the humidity, or the like may be used. For example, also a matter regarding the use history of a secondary battery may be used as a prerequisite condition. As a prerequisite condition regarding the use history, the number of performing charge and discharge, the total use time, or the like may be used.

As the causes of deterioration of a secondary battery, the reactivity with an electrolyte, a damage due to expansion or contraction of an active material or the like may be expected. However, specifying the cause of deterioration of a secondary battery is difficult. The deterioration condition varies according to the storage condition, the use history, or the like of a secondary battery. Therefore, deterioration speed calculation graphs for various prerequisite conditions and reference parameters are calculated in advance, and a deterioration speed calculation graph matching the state of the storage battery 1 is used. That is, a deterioration speed calculation graph calculated on the basis of the inspection result of a secondary battery the state of which is substantially same as the state of the storage battery 1 is used. Accordingly, the deterioration speed of the storage battery 1 can be accurately estimated.

Since various inspections are performed, various reference parameters are assumed. The reference parameters may include one indicating the state of a secondary battery, such as the SOC, the C-rate (charge/discharge current value), and the potential in the active material of the positive electrode or the negative electrode, for example. An environment-related matter such as the temperature and the humidity or a matter related to the use history of a secondary battery may be used as a reference parameter. In addition, the prerequisite condition may be considered as a constant reference parameter.

Figure 10A:
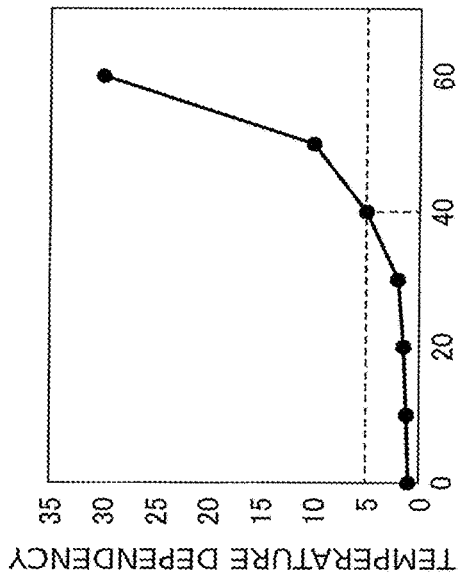
FIG. 10A to 10D are graphs each illustrating a deterioration model.

FIG. 10A is an (SOC-deterioration speed) graph illustrating the relationship between the SOC and the deterioration speed of the positive electrode in a secondary battery which satisfies a certain prerequisite condition. The abscissa represents the SOC and the ordinate represents the relative deterioration speed of the positive electrode. The relative deterioration speed represents a relative value when the lowest deterioration speed is "1". Hereinafter, the deterioration speed refers to a relative value, unless otherwise noted. FIG. 10A illustrates that, in a secondary battery which satisfies a certain prerequisite condition, when the SOC is 20 to 60%, the deterioration speed of the positive electrode is low, and when the SOC is less than 20% or greater than 60%, the deterioration speed of the positive electrode is high.

For example, it is assumed that when the deterioration information in FIG. 10A corresponds to the storage battery 1, an allowable deterioration speed is specified to be 1.5 or lower. Here, the deterioration speed calculation graph in FIG. 10A shows that the lower limit of the SOC is approximately 10% and the upper limit of the SOC is approximately 80%. Accordingly, the condition of use of the positive electrode of the storage battery 1 is that the range of the SOC is approximately 10% to approximately 80%.

Figure 10B:
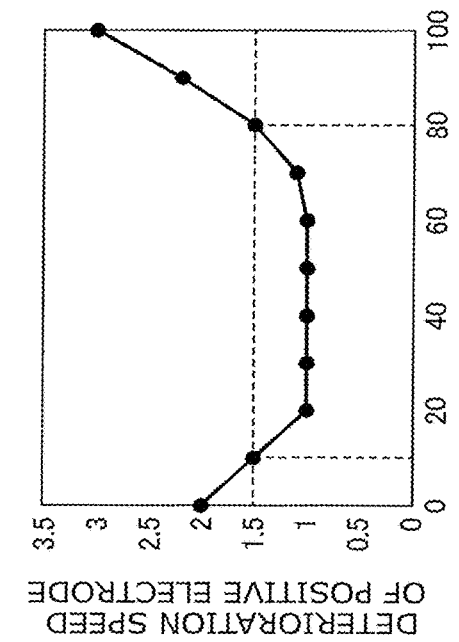

FIG. 10B is a graph illustrating the relationship between the SOC and the deterioration speed of the negative electrode in a secondary battery which satisfies a certain prerequisite condition. Unlike the graph in FIG. 10A, also in the range where the SOC is less than 20%, the deterioration speed of the negative electrode is low. In this way, the deterioration speeds of the positive electrode and the negative electrode are not necessarily same even when the reference parameters are same.

For example, it is assumed that when the deterioration information in FIG. 10B corresponds to the storage battery 1, the allowable deterioration speed is specified to be 1.5 or lower. Here, the deterioration speed calculation graph in FIG. 10B shows that the lower limit of the SOC is 0% and the upper limit of the SOC is approximately 75%. Accordingly, the condition of use of the negative electrode of the storage battery 1 is that the range of the SOC is approximately 0% to approximately 75%.

From comparison with FIG. 10A and FIG. 10B, the deterioration speeds of the positive electrode and the negative electrode may differ from each other in a case where deterioration progress is considered. Therefore, any one of a condition of use (second condition of use) of the positive electrode of the storage battery 1 and a condition of use (third condition of use) of the negative electrode of the storage battery 1 may be set to the condition of use (first condition of use) of the storage battery 1. Otherwise, with the conditions of use for both the positive electrode and the negative electrode of the storage battery 1 taken into consideration, the condition of use of the storage battery 1 may be created. For example, the condition of use of the storage battery 1 may be calculated on the basis of the condition of use for the deterioration speed of the positive electrode being not more than a specified value and the condition of use for the deterioration speed of the negative electrode being not more than a specified value. In the case where the condition of use for one electrode is wide but the condition of use for the other electrode is narrow, if the wider condition of use is adopted as the condition of use, the deterioration speed of the other electrode results in rising. Accordingly, the condition of use preferably depends on the narrower one of the condition of use of the positive electrode and the condition of use of the negative electrode. Accordingly, the condition of use with deterioration of both the positive electrode and the negative electrode taken into consideration can be calculated.

For example, when as above, the condition of use of the positive electrode is an SOC range being approximately 10% to approximately 80% and the condition of use of the negative electrode is an SOC range being approximately 0% to approximately 75%, the condition of use of the storage battery 1 may be set to an SOC range being approximately 10% to approximately 75%. Notably, a range regarding the condition of use of the storage battery 1 may be within a range regarding the condition of use of the positive electrode and within a range regarding the condition of use of the negative electrode. For example, the condition of use of the storage battery 1 may be set to a range of approximately 20% to approximately 70%, which is narrower than the range of approximately 10% to approximately 75%.

Moreover, while in the above, the condition of use of the storage battery 1 is calculated after the condition of use of the positive electrode and the condition of use of the negative electrode are calculated, the condition of use of the storage battery 1 may be calculated after a deterioration model of the storage battery 1 is calculated by combining a deterioration model regarding the positive electrode and a deterioration model regarding the negative electrode. In other words, the condition of use of the storage battery 1 may be calculated from a graph obtained by combining a deterioration speed calculation graph regarding the positive electrode and a deterioration speed calculation graph regarding the negative electrode.

As above, the condition-of-use calculator 273 creates the condition of use indicating a range of the value of an allowed SOC. Moreover, the condition-of-use calculator 273 can create the condition of use in consideration of deterioration not only of the positive electrode but also of the negative electrode.

Moreover, as the reference parameters used for calculating the condition of use, the estimation values of the inner state parameters or the battery characteristics estimated by the battery characteristic estimator 25 are used. Therefore, the calculated condition of use is an appropriate condition of use in accordance with present deterioration of the storage battery 1.

Moreover, as mentioned above, the battery characteristic estimator 25 can calculate the estimation values of the inner state parameters and the battery characteristics with high accuracy. Furthermore, accuracy of the estimation values is more enhanced by recalculating the estimation values of the inner state parameters or the battery characteristics on the basis of the internal resistance corrected by considering the electrolytic solution, the temperature and the like. In this way, the estimation values with high accuracy are used, and hence, accuracy of the calculated condition of use is also enhanced.

Figure 10C:
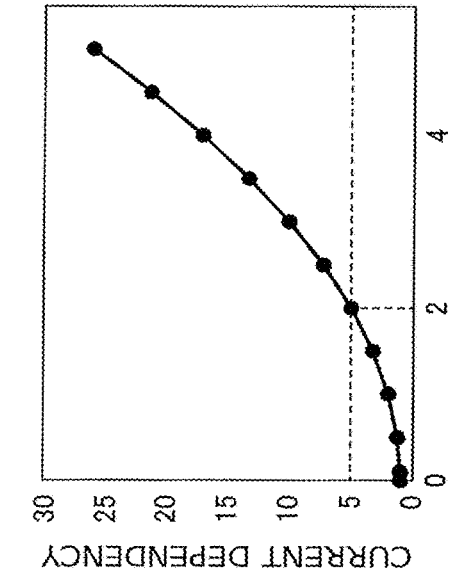

The condition-of-use calculator 273 may calculate a condition of use regarding a reference parameter other than the SOC. FIG. 10C is a graph illustrating the relationship between the temperature and the deterioration speed of a secondary battery. The dependency of the deterioration speed on the temperature during use or preservation is illustrated. For example, it is assumed that when the deterioration information in FIG. 10C corresponds to the storage battery 1, the allowable deterioration speed is specified to be 5 or lower. Here, the deterioration speed calculation graph in FIG. 10C shows that the lower limit of the temperature is 0° C. and the upper limit of the temperature is approximately 40° C. Accordingly, the condition of use of the storage battery 1 is that the range of the temperature is approximately 0° C. to approximately 40° C.

Figure 10D:
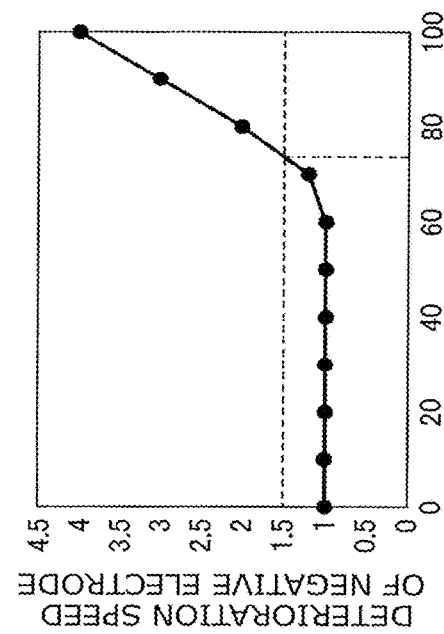

FIG. 10D is a graph illustrating the relationship between the C-rate and the deterioration speed of a secondary battery. Dependency of the deterioration speed on the C-rate is illustrated therein. For example, it is assumed that when the deterioration information in FIG. 10D corresponds to the storage battery 1, the allowable deterioration speed is specified to be 5 or lower. Here, the deterioration speed calculation graph in FIG. 10D shows that the lower limit of the C-rate is 0 and the upper limit of the C-rate is approximately 2 C. Accordingly, the condition of use of the storage battery 1 is that the range of the C-rate is 0 to approximately 2 C. In this way, a condition of use indicating a range of the value of the current regarding charge or discharge may be created. Moreover, a condition of use obtained by combining conditions of use regarding the SOC, the current and others may be created.

Notably, while the target values of the deterioration speeds of the positive electrode, the negative electrode and the storage battery 1 are set to the same values, they are not necessarily the same. With deterioration states, future uses, and purposes of use of the positive electrode and the negative electrode taken into consideration, the target values of the deterioration speeds of the positive electrode and the negative electrode may be determined.

Moreover, in the above, the condition of use is calculated from the graphs indicating the relationships between the reference parameters and the deterioration speed. Another condition of use may be calculated on the basis of the calculated condition of use and a deterioration model indicating relationship between the reference parameters.

Figure 11A:
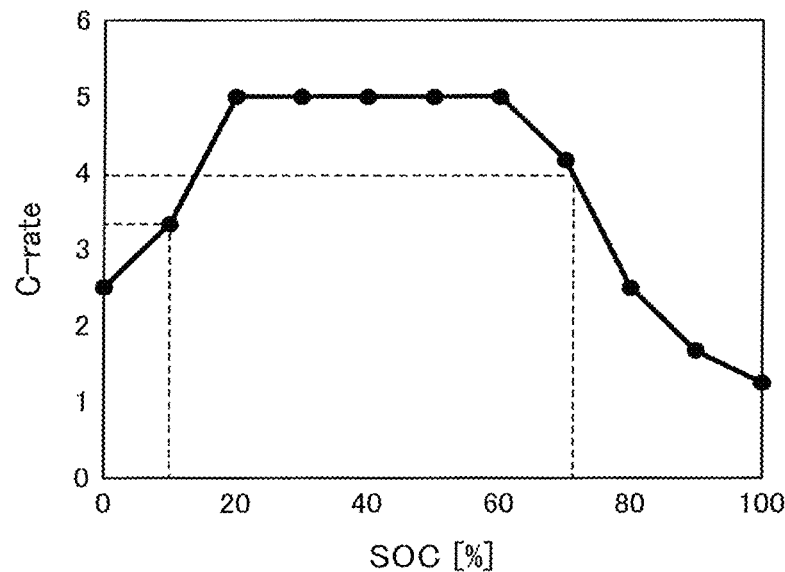
FIGS. 11A and 11B are diagrams for explaining calculation of new conditions of use.
Figure 11B:
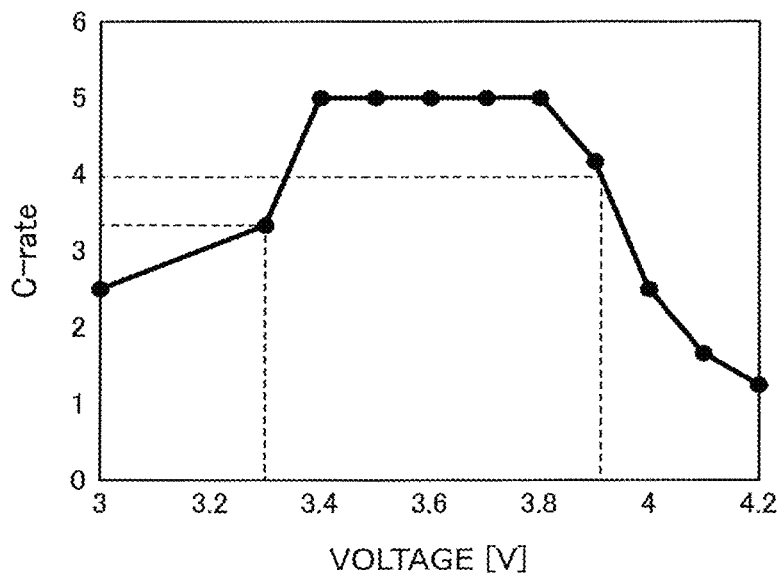

FIGS. 11A and 11B are diagrams for explaining calculation of new conditions of use. FIGS. 11A and 11B are graphs illustrating relationships between reference parameters. FIG. 11A is a graph illustrating relationship between the SOC and the maximum value of the C-rate (storage battery maximum current value). After having obtained the SOC range, the condition-of-use calculator 273 may calculate a range of the C-rate on the basis of the graph in FIG. 11A. When the SOC range is approximately 10% to approximately 75% and charge/discharge is performed at a constant current, the graph in FIG. 11A shows that the range of the maximum value of the C-rate is approximately 3.2 C to approximately 5.0 C. In this case, the current is the lower limit or lower of the range of the maximum value of the C-rate, in other words, approximately 3.2 C or lower. In this way, the condition of use regarding the current is obtained.

FIG. 11B is a graph illustrating relationship between the C-rate and voltage. When the SOC range is approximately 10% to approximately 75% and charge/discharge is performed at a constant current, the graph in FIG. 11B shows that the range of the voltage is approximately 3.3 V to approximately 3.9 V since the graph in FIG. 11A shows that the value of the C-rate at approximately 10% of SOC is approximately 3.2 C and the value of the C-rate at approximately 75% of SOC is approximately 4.0 C. In this way, the condition of use regarding the voltage is obtained.

Notably, the condition-of-use calculator 273 may convert the acquired deterioration model to create a new deterioration model. For example, the condition-of-use calculator 273 may create the graph indicating the relationship between the C-rate and the voltage illustrated in FIG. 11B from the graph indicating the relationship between the C-rate and the SOC illustrated in FIG. 11A, not from the deterioration information acquirer 272. Conversion of the SOC into the voltage only has to use the SOC-OCV curve calculated by the battery characteristic estimator 25 and the aforementioned calculation expression of the voltage.

When calculating a condition of use which uses the voltage or the like, which can be easily measured in charging, as a reference parameter as in FIG. 11B, the storage battery 1 can be used, linked with the measurement result of the voltage by the measurer 22.

When the condition of use can be calculated on the basis of the voltage or the like as above, even a simple electronic device that cannot directly measure the inner state parameters but can measure the voltage of the storage battery 1 can function as the charge/discharge control apparatus 2 to perform charge/discharge satisfying the condition of use. Thereby, a function of directly measuring the inner state parameters is unnecessary, and costs regarding production of the electronic device can be suppressed.

Instead of the deterioration speed calculation graph, a function for calculating a deterioration speed may be used. For example, the approximation function of the deterioration speed calculation graph may be used.

Figure 12A:
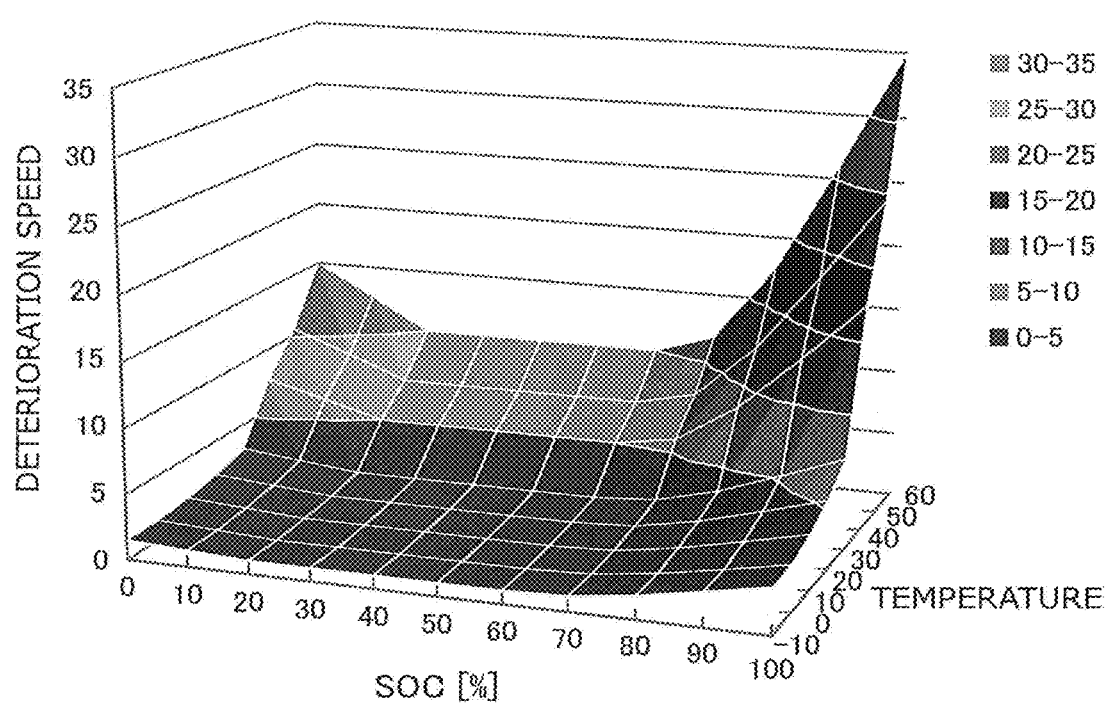
FIGS. 12A and 12B are graphs each illustrating a deterioration map.
Figure 12B:
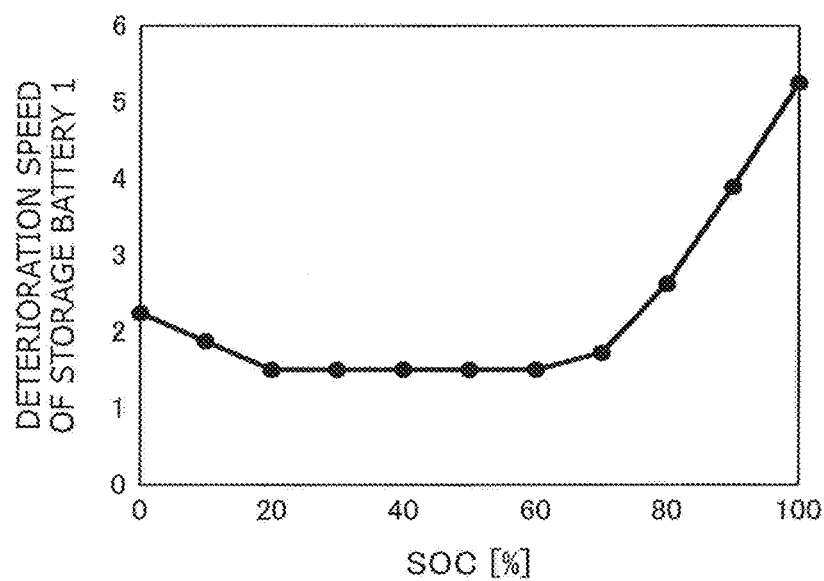

Next, a deterioration map is described. FIGS. 12A and 12B are graphs each illustrating a deterioration map. The deterioration map is a multidimensional graph composed of a plurality of elements, and is an aggregate of deterioration speed calculation graphs of deterioration models. For example, the deterioration map may be obtained by quantitatively mapping the deterioration speeds with respect to the temperature, the SOC, and the C-rate. Similarly to the deterioration model, the deterioration map may exist for each of the positive electrode and the negative electrode. The deterioration map of a secondary battery may be created from the deterioration map of the positive electrode and the deterioration map of the negative electrode.

FIG. 12A is a three-dimensional graph indicating the relationship among three reference parameters which are the temperature, the SOC, and the deterioration speed, when the C-rate is a certain value. The deterioration map in FIG. 12A exists for each value of the C-rate. The cross-section graph (a two-dimensional graph) of FIG. 12A taken along a plane orthogonal to the axis of the temperature is a deterioration speed calculation graph with the C-rate and the temperature as the prerequisite condition and the SOC as a reference parameter. The cross-section graph of FIG. 12A taken along a plane orthogonal to the axis of the SOC is a deterioration speed calculation graph with the C-rate and the SOC as the prerequisite condition and the C-rate as a reference parameter. In this way, a prerequisite condition is one of the reference parameters.

FIG. 12B is an example of a cross-sectional graph of FIG. 12A. FIG. 12B is a two-dimensional graph illustrating relationship between two reference parameters of the SOC and the deterioration speed in the case where the C-rate and the temperature are specified. In this way, a cross-sectional graph of the three-dimensional deterioration map becomes a deterioration model. Therefore, since the deterioration map becomes similar to a deterioration model in the case where values of a plurality of reference parameters are specified, the condition of use of the storage battery 1 can be calculated even using a deterioration map.

As described above, a deterioration model and a deterioration map each include data on relationship one or more reference parameters such as an SOC and a C-rate, and the deterioration speed.

The condition-of-use calculator 273 may generate a deterioration map on the basis of a deterioration model, or may generate a deterioration model on the basis of a deterioration map.

Notably, while the condition of use calculated by the condition-of-use calculator 273 should be for preventing deterioration of the storage battery 1, it can also be considered that another condition of use not relevant to deterioration of the storage battery 1 is assigned to the storage battery 1. Therefore, the condition-of-use calculator 273 may change the calculated condition of use with the other condition of use taken into consideration. For example, there can also be a case where when the storage battery 1 is used in accordance with the once-calculated condition of use, a predetermined charge/discharge capacity is not obtained. In such a case, the condition of use may be changed depending on which of the deterioration progress and the charge/discharge capacity is prioritized. When the charge/discharge capacity is prioritized, a range having margins on the once-calculated condition of use by several percentages may be specified as the condition of use. Accordingly, the charge/discharge controller 21 can adjust the condition of use within the range, considering the state or the like of the storage battery 1, measured by the measurer 22 during charge.

In this may, the condition-of-use calculator 273 calculates the condition of use for the deterioration speed being not more than the specified value.

Figure 13:
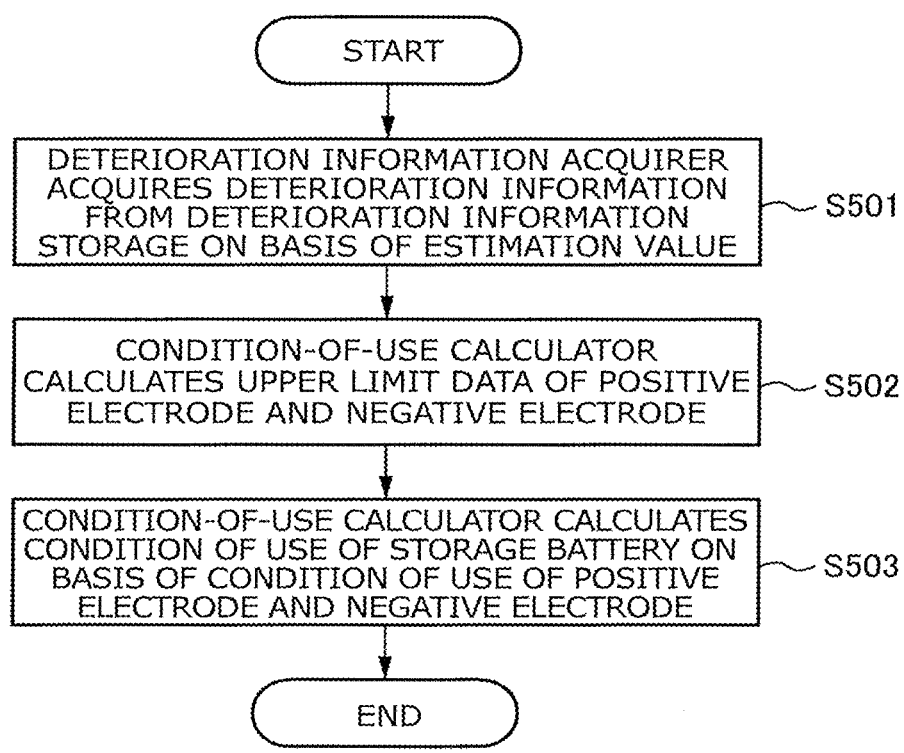
FIG. 13 is a diagram illustrating an example of a flowchart of a calculation process of conditions of use.

FIG. 13 illustrates an example of a flowchart of a condition of use calculation process. The condition-of-use calculation process is performed after calculation of the estimation values of the battery characteristics or the like of the storage battery 1 by the battery characteristic estimator 25 or the internal-resistance corrector 26.

The deterioration information acquirer 272 acquires deterioration information corresponding to the storage battery 1 from the deterioration information storage 271, on the basis of the estimation values of inner state parameters or battery characteristics acquired from the battery characteristic estimator 25 or the internal-resistance corrector 26 (S501).

In the case where the deterioration information storage 271 is realized by a database or the like and the battery characteristics or the like are recorded as attribution corresponding to deterioration information, the deterioration information can be extracted on the basis of the estimation value of the battery characteristics or the like by using a management function such as a RDBMS. When the estimation value does not completely match the value of the battery characteristic or the like corresponding to deterioration information but the difference therebetween is within an allowable range, the deterioration information may be extracted.

The condition-of-use calculator 273 calculates the condition of use with respect to each of the positive electrode and the negative electrode, on the basis of deterioration information acquired by the deterioration information acquirer 272 (S502). The condition-of-use calculator 273 integrates the condition of use of the positive electrode and the condition of use of the negative electrode, and calculates the condition of use of the storage battery 1 (S503). The flowchart of the condition-of-use calculation process has been described above. The calculated condition of use may be transmitted to the deterioration information storage 271, the storage 24, or the charge/discharge controller 21.

A calculated condition of use may be recreated when the state of the storage battery 1 is determined to have changed. Change of the state of the storage battery 1 may be determined by the battery characteristic estimator 25 or the condition-of-use creator 27. Otherwise, the state of the storage battery 1, the deterioration information corresponding to the relevant state, and the like being output through a not-shown output device, a user of the storage battery 1, an administrator of the charge/discharge control apparatus 2, or the like who has seen the relevant output may give an instruction of change of the specified value of the deterioration speed, update of the condition of use, or the like through a not-shown input device.

Whether the state of the storage battery 1 has changed or not may be determined on a reference value for update, which is determined in advance. For example, when a change amount of the battery capacity, the voltage, the internal resistance or the inner state parameter decreases or increases more than a reference value, it may be determined that the state of the storage battery 1 is changed. The reference value may be freely determined.

Figure 14:
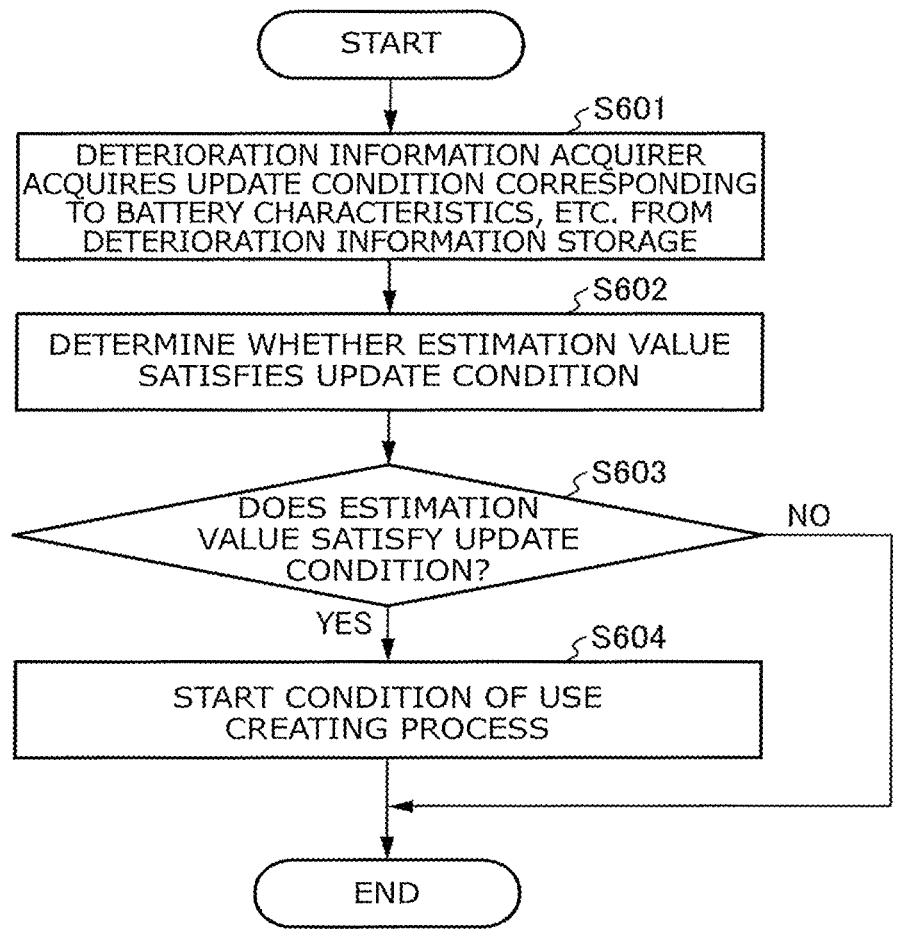
FIG. 14 illustrates an example of a flowchart of a condition of use update process.

FIG. 14 illustrates an example of a flowchart of a condition of use update process. Here, update is assumed to be determined by the condition-of-use creator 27. The deterioration information acquirer 272 acquires the estimation value of an inner-state parameter or a battery characteristic from the battery characteristic estimator 25 or the internal-resistance corrector 26, and acquires an update condition corresponding to the acquired battery characteristic from the deterioration information storage 271 (S601). The update condition is assumed to be stored in the deterioration information storage 271 in advance. The deterioration information acquirer 272 determines whether the acquired battery characteristic or the like satisfies the update condition (S602).

When the battery characteristic or the like does not satisfy the update condition (No at S603), the update process is ended. When the battery characteristics or the like satisfies the update condition (Yes at S603), a condition of use creating process is started (S604).

For a plurality of the estimation values, the deterioration information acquirer 272 may determine to perform update when at least one of the battery characteristics or the like satisfies the update condition. Alternatively, the deterioration information acquirer 272 may determine to perform update when a predetermined number or more, or all of the battery characteristics or the like satisfy the update condition. Whether the estimation value satisfies the update condition may be determined by a component other than the deterioration information acquirer 272.

It has been assumed in the above description that update of a condition of use is performed when the estimation value of the battery characteristic or the like estimated by the battery characteristic estimator 25 or the like satisfies the update condition. However, due to load on the charge/discharge control apparatus 2 or the like, an estimation process of a battery characteristic or the like may not frequently be performed. In such a case, the condition-of-use calculator 273 may calculate a tentative estimation value of the battery characteristic or the like on the basis of a hypothetical condition that deterioration constantly progresses or the similar condition to determine whether or not the update condition is satisfied on the basis of the tentative estimation value. Accordingly, even when the interval of an inspection of the storage battery 1 is made longer, failing to update a condition of use is prevented.

As described above, according to the first embodiment, the inner state parameters and the battery characteristics of the storage battery 1 can be estimated on the basis of the voltage and the current of the storage battery 1. Furthermore, a condition of use which provides the speed of deterioration due to use equal to or less than a specified value can be created on the basis of the value transition of the inner state parameters or the battery characteristics. In this way, the condition of use calculated according to the first embodiment is a condition of use corresponding to the deterioration state of the storage battery 1. The positive electrode and the negative electrode of the storage battery 1 have different deterioration states. According to the first embodiment, the condition of use of the storage battery 1 can be calculated in consideration of deterioration of both the positive electrode and the negative electrode. Moreover, the condition of use can be updated in accordance with the deterioration state of the storage battery 1, and thereby, excessive deterioration can be suppressed while achieving the performance of the storage battery 1. Moreover, the deterioration state can be easily estimated with high accuracy without necessity of direct measurement of the inner state parameters.

Second Embodiment

In the first embodiment, the deterioration information acquirer 272 acquires deterioration information corresponding to the storage battery 1 from deterioration information stored in the deterioration information storage 271. However, due to the wide variation of the state of the storage battery 1, if all kinds of deterioration information are stored in the deterioration information storage 271, the capacity of the deterioration information storage 271 becomes large. There is a possibility that deterioration information corresponding to the storage battery 1 is not found in the deterioration information storage 271. Therefore, in the second embodiment, deterioration information is acquired and updated from outside. Accordingly, an amount of deterioration information stored in the deterioration information storage 271 can be reduced, so that downsizing of the condition-of-use creator 27 and reduction in cost for manufacturing the condition-of-use creator 27 can be achieved. Furthermore, the number of kinds of the supported storage battery 1 can be increased.

Figure 15:
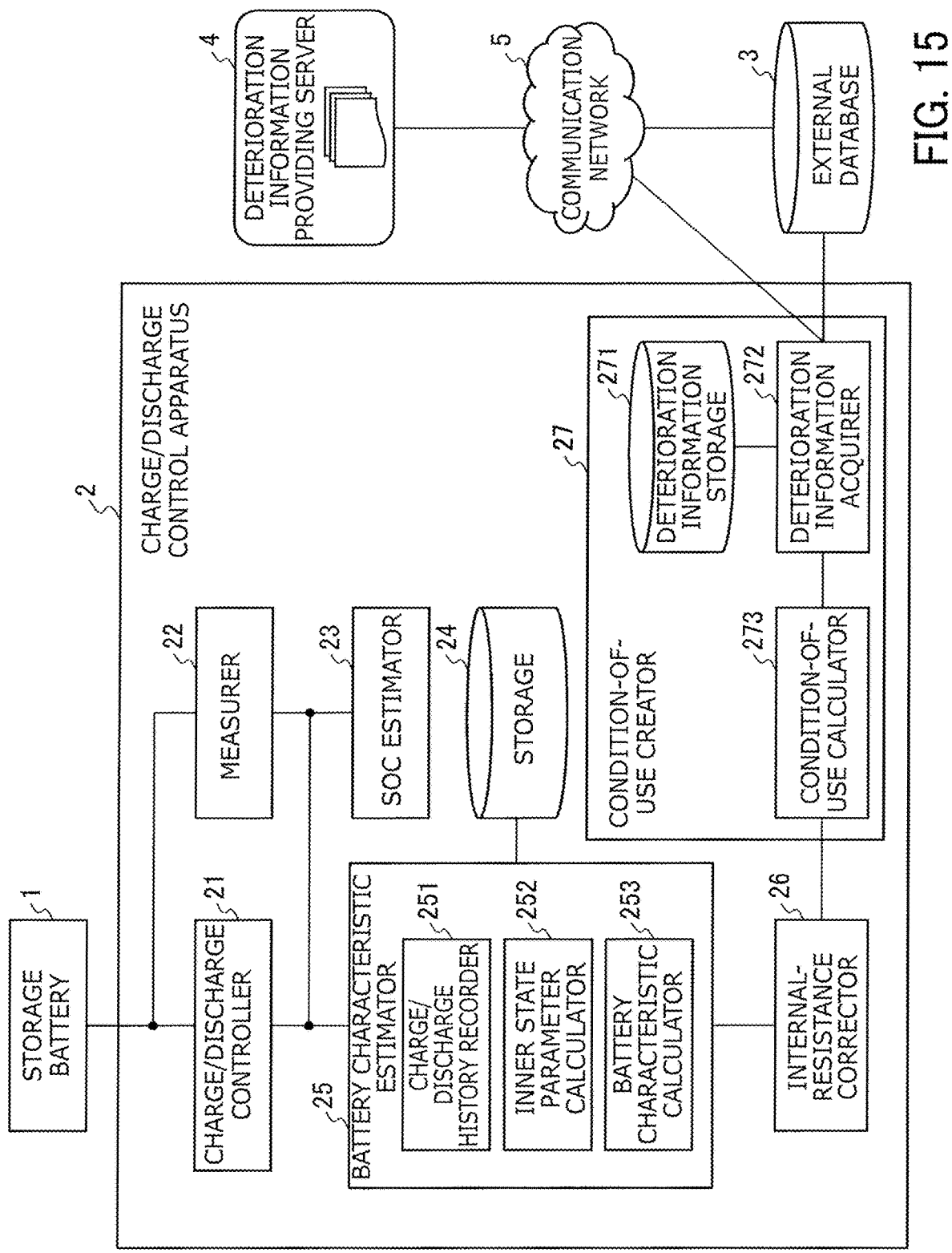
FIG. 15 is a block diagram illustrating an example of a schematic configuration of a power storage system according to a second embodiment.

FIG. 15 is a block diagram illustrating an example of a schematic configuration of a power storage system according to the second embodiment. The second embodiment differs from the first embodiment in that the deterioration information acquirer 272 is connected to the outside in the second embodiment. Descriptions of the features identical to those in first embodiment are omitted.

The deterioration information acquirer 272 is connected to a device or the like that provides deterioration information via wired or wireless communication, or via an electric signal so as to transmit and receive data. The device or the like that provides deterioration information is not limited to a particular device, and may be an external database 3 storing deterioration information or may be a deterioration information providing server 4 that generates and provides deterioration information. Hereinafter, the device or the like that provides deterioration information is referred to as "deterioration information providing device". The deterioration information acquirer 272 may be connected to the deterioration information providing device via a communication network 5. Alternatively, the deterioration information acquirer 272 may be connected directly or indirectly to the external database 3 via a device interface.

Acquisition of deterioration information by the deterioration information acquirer 272 is assumed to be performed when deterioration information corresponding to the storage battery 1 is lacked. However, such a timing is not limited to a particular timing. For example, acquisition may be performed when the deterioration information providing device generates new deterioration information, or may be performed regularly. When necessary deterioration information is not found in the deterioration information storage 271, deterioration information corresponding to the standard, battery characteristics, inner state parameters, or the like of the storage battery 1 is acquired on the basis thereof. Deterioration information may be acquired from the deterioration information providing device without specifying a condition and the like. Deterioration information which has been acquired but is considered not to be necessary may not be stored in the deterioration information storage 271.

The deterioration information storage 271 may delete deterioration information stored therein. For example, for capacity saving, it is not necessary for the deterioration information storage 271 to store therein deterioration information satisfying a predetermined deletion condition, such as expired deterioration information and deterioration information which is seldom used.

The deterioration information acquirer 272 may acquire information other than deterioration information. The deterioration information acquirer 272 may be connected to a device or the like other than the deterioration information providing device. For example, the deterioration information acquirer 272 may acquire information on future use of the storage battery 1, from a server or the like managing the storage battery 1. For example, the deterioration information acquirer 272 may acquire information on the future use, the standard to be outputted, the limiting condition, or the like of the storage battery 1. After the battery characteristic estimator 25 predicts the battery characteristics, the inner state parameters, the lifetime, and the like of the storage battery 1 under the future use environment, a process for calculating a condition of use may be performed on the basis of the prediction.

In addition, the deterioration information acquirer 272 may output information to an external device and the like. In other words, the deterioration information acquirer 272 can also be regarded as an output device. The deterioration information acquirer 272 may output, for example, the conditions of use calculated by the condition-of-use calculator 273, the deterioration information or the estimation values used for calculating the conditions of use, and the like to an external device or the like such as a database, a file server or an image display device. In this way, such an external device or the like as an output destination enables a user or the like to recognize the conditions of use and the like.

Figure 16:
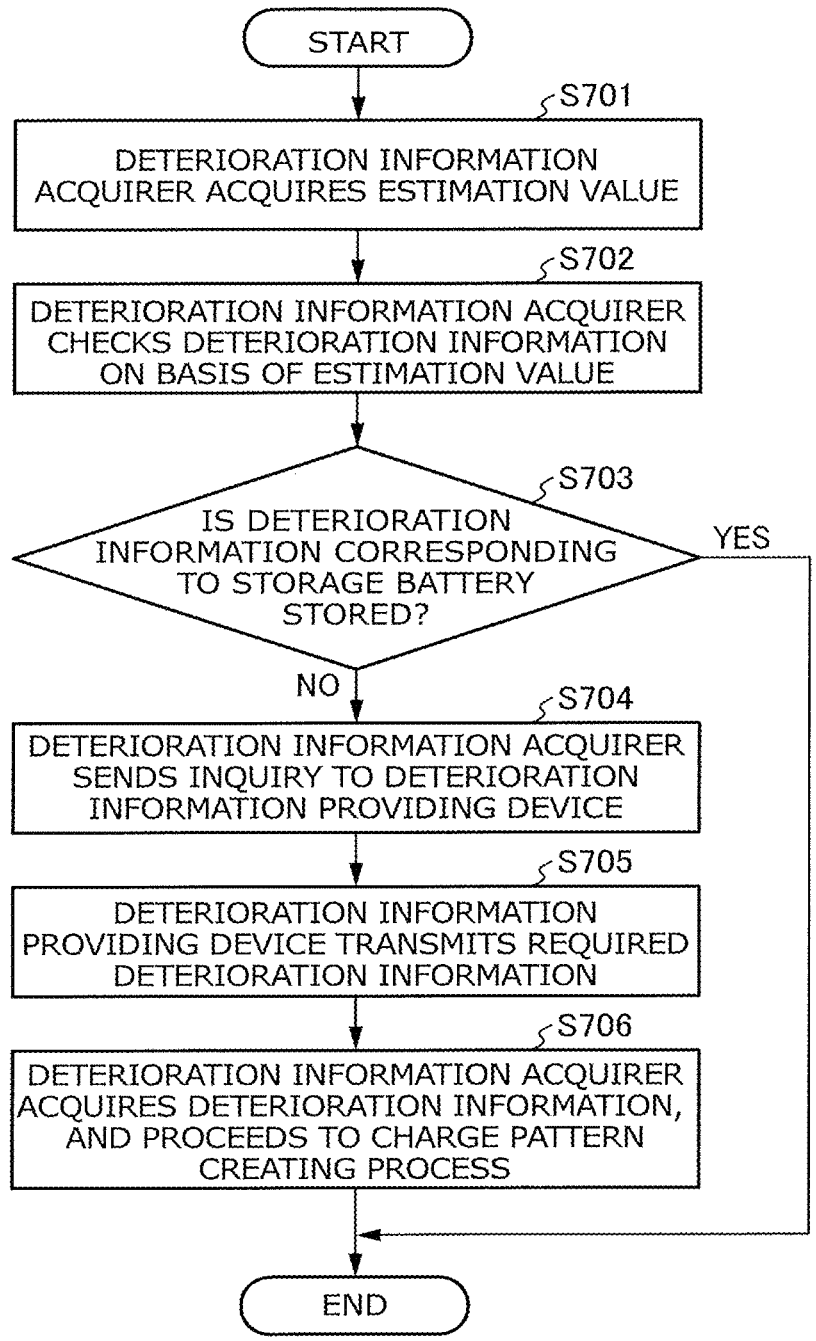
FIG. 16 illustrates an example of a flowchart of a deterioration information acquisition process.

FIG. 16 illustrates an example of a flowchart of a deterioration information acquisition process. The flowchart illustrates a flow in the case where deterioration information is acquired before a condition of use is created.

The deterioration information acquirer 272 acquires the estimation value of a battery characteristic or the like of the storage battery 1 from the battery characteristic estimator 25 or the internal-resistance corrector 26 (S701). The condition-of-use calculator 273 determines whether the deterioration information storage 271 stores therein deterioration information corresponding to the storage battery 1, on the basis of the acquired estimation value (S702).

When the deterioration information storage 271 stores deterioration information corresponding to the storage battery 1 (Yes at S703), the flow is ended. When the deterioration information storage 271 does not store deterioration information corresponding to the storage battery 1 (No at S703), the deterioration information acquirer 272 sends an inquiry to the deterioration information providing device (S704). The inquiry is assumed to include the acquired estimation value.

The deterioration information providing device transmits deterioration information required for calculation of a condition of use on the basis of the received estimation value of the battery characteristic or the like (S705). Subsequently, the deterioration information acquirer 272 acquires the transmitted deterioration information, and proceeds to the condition of use creating process (S706). The condition of use creating process is as above. The flow of the deterioration information acquisition process has been described.

As described above, according to the second embodiment, even if deterioration information required for calculating a condition of use is not stored in the deterioration information storage 271, required deterioration information can be acquired on the basis of the battery characteristics or the like of the storage battery 1. Therefore, an amount of deterioration information stored in the deterioration information storage 271 can be reduced, and thereby downsizing of the condition-of-use creator 27 or reduction in cost for manufacturing the condition-of-use creator 27 can be achieved. Moreover, the number of types of the supported storage battery 1 can be increased.

Moreover, in the embodiments described above, the charge/discharge controller 21 charges/discharges the storage battery 1 on the basis of the created condition of use. In this stage, the charge/discharge controller 21 is needed to determine whether the condition of use is satisfied. For example, since when the SOC range is defined as the condition of use, the value of the SOC cannot be directly acquired, the charge/discharge control apparatus 2 obtains the value of the SOC using the data indicating the relationship between the voltage and the SOC as illustrated in FIG. 7, the data indicating relationship between the internal resistance and the SOC, and the like.

However, there is also a unit cell difficult in highly accurately estimating the SOC from the voltage or the internal resistance. For example, an assembled battery that is used, for example, for the purpose of a large power supply system preferably has a wide SOC range, of course, and has a small fluctuation in outputtable power within a used SOC range in order to obtain stable power. Therefore, each of a plurality of unit cells in the assembled battery is preferably small in rate of change of the voltage with respect to the SOC and in rate of change of the internal resistance with respect to the SOC within the used SOC range. However, when using unit cells small in the rates of change within the used SOC range, they are paradoxically difficult in highly accurately estimating the SOC from the voltage or the internal resistance.

Therefore, when using an assembled battery as a target to be charge/discharged by the charge/discharge control apparatus 2, it is preferably an assembled battery in which at least two unit cells are connected in series and which includes at least one detection unit cell. The detection unit cell is a unit cell larger in absolute value of the rate of change of the voltage with respect to the SOC than the other unit cells within the SOC range in the condition of use. With such an assembled battery, it can be determined whether the assembled battery satisfies the condition of use regarding the SOC by the detection unit cell.

Figure 17:
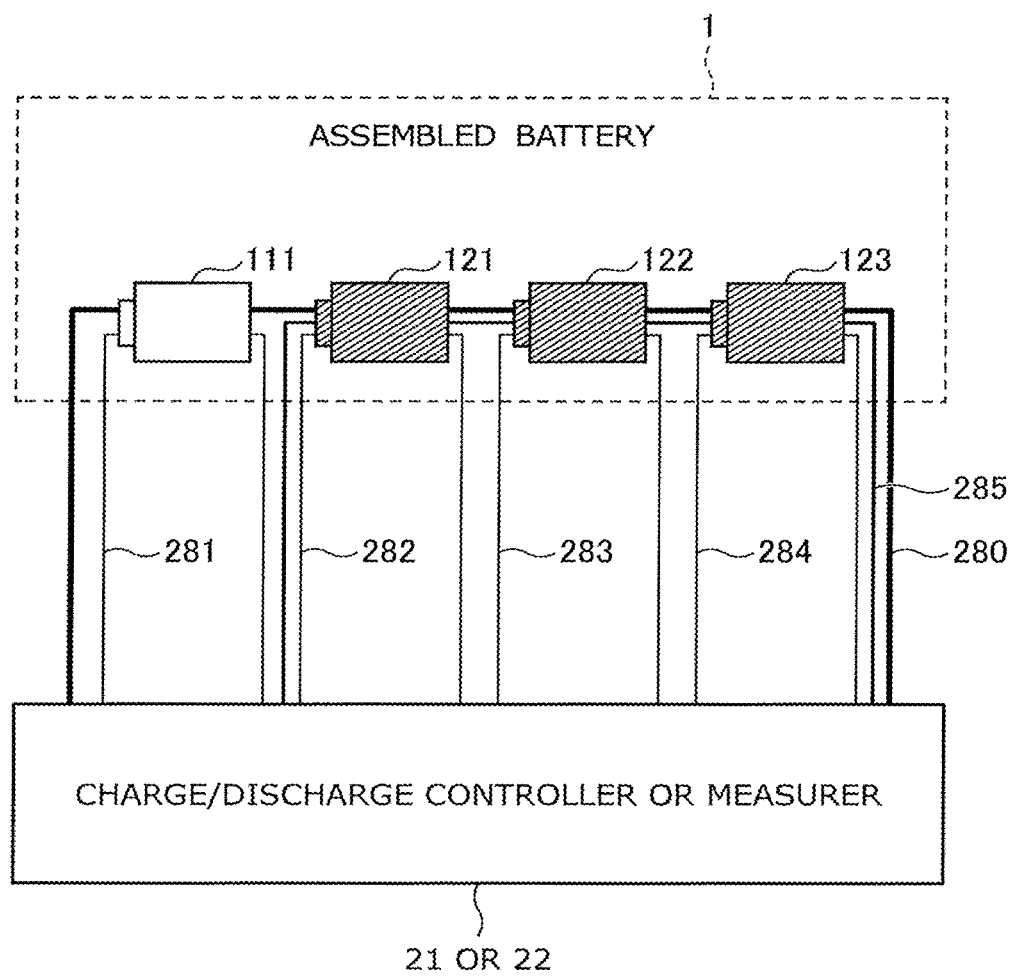
FIG. 17 is a diagram illustrating an example of an assembled battery.

FIG. 17 is a diagram illustrating an example of the assembled battery. FIG. 17 illustrates a detection unit cell 111 and other unit cells (high performance cells) 121, 122 and 123 different from the detection unit cell 111. Moreover, FIG. 17 illustrates circuit lines 280 to 285. The circuit line 280 is for charging/discharging the whole assembled battery. The circuit lines 281 to 284 are for individually charging/discharging the corresponding unit cells. The circuit line 285 is for charging/discharging the entirety of the high performance cells. Moreover, the circuit line 285 is used for acquiring the charge curve needed for estimating the inner states of only the high performance cells. With the circuit line 280, it is difficult to acquire the charge curve of the entirety of the high performance cells since the detection cell is included therein. The reason is that when the current is being supplied to the high performance cells for their full charge, the detection cell smaller in battery capacity than the high performance cells is brought to an overcharged state, which causes its deterioration to progress, and furthermore, causes a situation such as firing to arise. Therefore, the circuit line 285 is used. When charging/discharging the whole assembled battery, the same current flows in the unit cells since the unit cells are connected in series by the circuit line 280. Therefore, the unit cells are being evenly charged. Then, the value of the SOC of the detection unit cell 111 can be calculated on the basis of the voltage of the circuit line 281. Therefore, it can be determined whether the whole assembled battery or the high performance unit cells are within the SOC range on the basis of the voltage of the detection unit cell 111.

Figure 18:
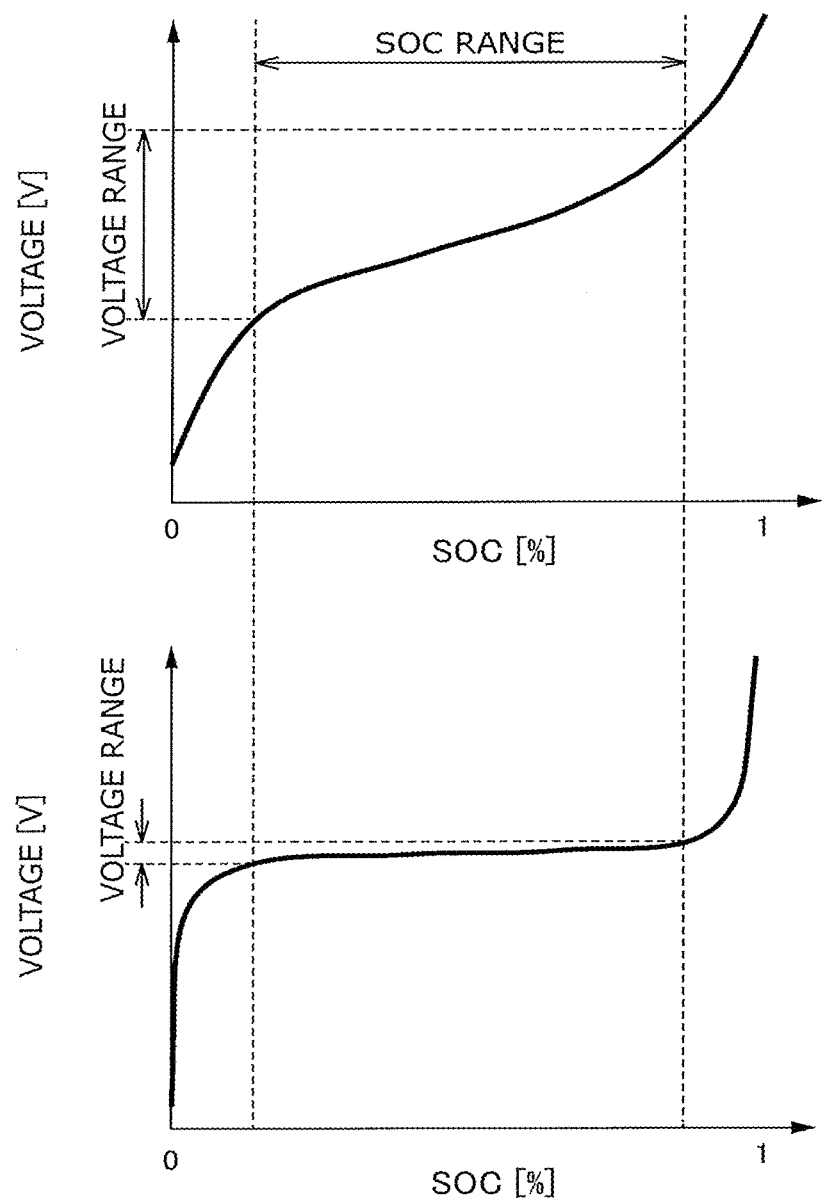
FIG. 18 is a diagram illustrating examples of SOC-OCV curves of a detection unit cell and a high performance unit cell.

FIG. 18 is a diagram illustrating examples of the SOC-OCV curves of the detection unit cell and the high performance unit cell. The upper graph presents the SOC-OCV curve of the detection unit cell. The lower graph presents the SOC-OCV curve of the high performance unit cell. In the lower graph, it is difficult to calculate the value of the SOC in accordance with the value of the voltage with high accuracy since the voltage range corresponding to the SOC range is narrow. Meanwhile, in the upper graph, the value of the SOC can be calculated in accordance with the value of the voltage with higher accuracy than in the lower graph since the upper graph has a larger rate of change of the voltage relative to the SOC than the lower graph. In other words, calculation of the SOC from the voltage achieves higher accuracy using the detection unit cell.

Therefore, the charge/discharge controller 21 is desirable to charge/discharge the assembled battery when the detection unit cell satisfies the condition of use. The charge/discharge control apparatus 2 may beforehand recognize the circuit line regarding the detection unit cell or the detection unit cell. Otherwise, the charge/discharge control apparatus 2 may regard a unit cell larger in absolute value of the rate of change of the voltage relative to the SOC than the other unit cells as the detection unit cell. In other words, the charge/discharge controller may charge/discharge the assembled battery when the cell largest in absolute value of the rate of change of the voltage relative to the SOC satisfies the condition of use. The absolute value of the rate of change of the voltage relative to the SOC may be determined on the basis of the SOC-OCV curve or the like calculated by the SOC estimator. In this way, a user or the like is not needed to beforehand specify the detection unit cell.

Moreover, with an assembled battery having the aforementioned configuration, the unit cells can adopt high performance unit cells that are small in the relevant rate of change within the used SOC range, other than the detection unit cell, so that performance of the assembled battery can be improved. Moreover, an assembled battery small in voltage decrease can eliminate necessity of increasing the current along with the voltage decrease for an electric device that needs constant power. Hence, current lines connecting the unit cells can be made thin. Moreover, an electric device connected to the assembled battery, such, for example, as a PCS (power conditioner system), can reduce ranges of the voltage and the current to handle.

Moreover, the condition-of-use calculator 273 may set a condition of use regarding the SOC created on the basis of the cell smallest in absolute value of the rate of change of the voltage relative to the SOC (that is, the high performance cell) out of the unit cells constituting the assembled battery to be the condition of use for the assembled battery. There can be a case where as long as deterioration of high performance cells can be prevented, a detection unit cell may be allowed to deteriorate. Therefore, the condition-of-use calculator 273 may set the condition of use of the high performance cell to the condition of use of the assembled battery without the condition of use of the detection unit cell taken into consideration.

Moreover, the charge/discharge control apparatus 2 may adjust a difference in usable SOC range between the unit cells constituting the assembled battery (deviation in balance between the unit cells). By charging the high performance cells 121, 122 and 123 shown in FIG. 17 using circuit lines respectively corresponding to those, the SOC deviation between the high performance cells can be cancelled. Thereby, deterioration of the storage battery 1 can be prevented from progressing, and the life of the storage battery 1 can be prevented from deteriorating. A function of an existing balancer can be used for adjusting the deviation in cell balance.

The active materials of both electrodes of the detection unit cell 111 are not specially limited but they are preferably substances that increase the absolute value of the rate of change of the voltage in the SOC-OCV curve illustrated in FIG. 18. As the positive electrode active material of the detection unit cell 111, for example, NCM, LCO, LMO, NCA, or a mixture of two or more of these is suitable. NCM means a three-component positive electrode material (Li(Ni—Mn—Co)O$_2$). LCO means lithium cobaltate. LMO means lithium manganate. NCA means cobalt and aluminum-added lithium nickelate. As the negative electrode active material of the detection unit cell 111, for example, LTO, graphite, hard carbon or soft carbon is suitable. A mixture of two or more of graphite, hard carbon and soft carbon is also suitable. LTO means lithium titanate (Li$_4$Ti$_{12}$O$_{12}$). As the detection unit cell 111, a unit cell obtained by combining a positive electrode using the aforementioned positive electrode active material and a negative electrode using the aforementioned negative electrode active material is suitable. In particular, the charge/discharge control apparatus 2 preferably controls charge using a condition of use that a secondary battery whose negative electrode is LTO is used as the storage battery 1 and the negative electrode is not used in the last period of charge.

As the high performance cell, a secondary battery having a combination of electrodes of LFP and graphite or of LFP and LTO is suitable. LFP means lithium iron phosphate.

As mentioned above, as a target to be charged/discharged, there is desirable to be used an assembled battery configured by connecting a detection unit cell and a plurality of high performance cells in series, wherein the detection unit cell is larger in rate of change of a voltage relative to an SOC than the high performance cells within an SOC range calculated as a condition of use. Thereby, the charge/discharge control apparatus 2 can perform charge/discharge while satisfying the condition of use.

Each process in the embodiments described above can be implemented by software (program). Thus, the embodiments described above can be implemented using, for example, a general-purpose computer apparatus as basic hardware and causing a processor mounted in the computer apparatus to execute the program.

Figure 19:
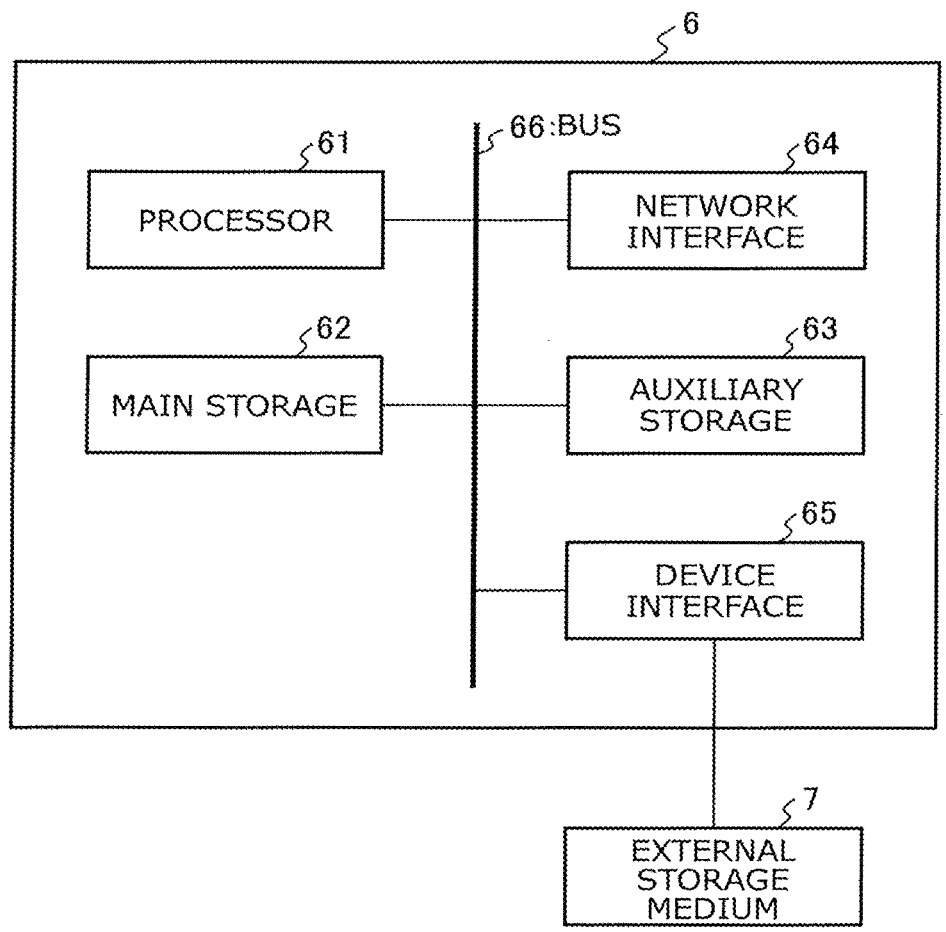
FIG. 19 is a block diagram illustrating an example of a hardware configuration according to an embodiment of the present invention.

FIG. 19 is a block diagram illustrating an example of a hardware configuration according to an embodiment of the present invention. The charge/discharge control apparatus 2 can be realized by a computer device 6 including a processor 61, a main storage 62, an auxiliary storage 63, a network interface 64, and a device interface 65, which are connected to one another via a bus 66.

The processor 61 reads out a program from the auxiliary storage 63, develops the program onto the main storage 62, and executes the program. As a result of this, functions of the charge/discharge controller 21, the measurer 22, the SOC estimator 23, the battery characteristic estimator 25, the internal-resistance corrector 26, and the condition-of-use creator 27 can be achieved.

The processor 61 is an electronic circuit including a controller and a calculator of a computer. As the processor 61, a general-purpose processor, a central processor (CPU), a microprocessor, a digital signal processor (DSP), a controller, a microcontroller, a state machine, an application specific integrated circuit, a field programmable gate array (FPGA), a programmable logic circuit (PLD), or the combination thereof can be used, for example.

The charge/discharge control apparatus 2 of the present embodiment may be realized by installing a program to be executed by the components into the computer device 6 in advance, or installing the program, which is stored in a storage medium such as a CD-ROM or the like is distributed via a network, into the computer device 6, as appropriate.

The main storage 62 is a memory that temporarily stores an instruction to be executed by the processor 61, various types of data, and the like, and may be a volatile memory such as a DRAM, or may be a non-volatile memory such as an MRAM. The auxiliary storage 63 is a storage that permanently stores a program, data, and the like. For example, the auxiliary storage 63 is a flash memory, for example.

The network interface 64 is an interface for wired or wireless connection to a communication network. In the case where the deterioration information acquirer 272 communicates with the deterioration information providing device, the communication processing function of the deterioration information acquirer 272 can be realized by the network interface 64. In the drawing, only one network interface 64 is illustrated, but a plurality of the network interfaces 64 may be mounted.

The device interface 65 is an interface such as a USB for connection to an external storage medium 7 that stores therein an output result and the like. In the case where the deterioration information providing device is the external storage medium 7, a function for data exchange between the deterioration information acquirer 272 and the external storage medium 7 can be realized by the device interface 65.

The external storage medium 7 may be an arbitrary storage medium such as an HDD, a CD-R, a CD-RW, a DVD-RAM, a DVD-R, a SAN (storage area network), or the like. The external storage medium 7 may be connected to the storage battery 1 via the device interface 65.

The computer device 6 may be configured by dedicated hardware such as a semiconductor integrated circuit having the processor 61 mounted thereon. The dedicated hardware may be configured by combination with a storage such as an RAM or an ROM. The computer device 6 may be incorporated inside the storage battery 1.

Moreover, the processes described above in the embodiments may be used as a condition-of-use creation method. For example, such a condition-of-use creation method may include estimating an estimation value of at least one inner state parameter of a first battery which is a secondary battery to be charged or discharged on the basis of data on voltage and current of the first battery measured in charging or discharging the first battery, and calculating at least one first condition of use regarding a first reference parameter which is one of one or more reference parameters regarding a secondary battery on the basis of first reference data which is reference data at least indicating relationship between a deterioration speed of the secondary battery and the one or more reference parameters and is set to correspond to the first battery on the basis of the estimation value and a specified value of the deterioration speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A charge/discharge control apparatus programmed to control charge or discharge of a first battery to be charged or discharged according to a value or a range of a state of charge (SOC) included in a condition of use to be satisfied during charge or discharge, the charge/discharge control apparatus comprising:
   a measurer programmed to measure, on an ongoing basis, a voltage and a current of the first battery in charging or discharging the first battery;
   a battery characteristic estimator programmed to estimate an estimation value of at least one inner state parameter of the first battery based on data on the voltage and current of the first battery measured in charging or discharging the first battery;
   a condition-of-use creator programmed to
      calculate the value or the range from (a) deterioration information of the first battery and (b) an estimation value of at least one inner state parameter of the first battery based on the data on voltage and current of the first battery measured in charging or discharging the first battery,
      calculate on an ongoing basis a deterioration speed of the first battery based on the deterioration information and a new estimation value when the new estimation value is estimated,
      determine, on an ongoing basis, when updating the value or the range is needed based on the deterioration speed calculated on the ongoing basis and an upper limit of the deterioration speed, and update, on an ongoing basis, the value or the range based on the new estimation value and the deterioration information when the condition-of-use creator determines that an update to the value or the range is needed, wherein the deterioration information indicates a relationship between a value of the at least one inner state parameter of the first battery and the deterioration speed of the first battery; and a charge/discharge controller programmed to control a current to/from the first battery to control the charge or discharge of the first battery (1) according to the value or the range in the condition of use initially calculated and (2) according to the value or the range in the condition of use updated based on the change of the at least one inner state parameter of the first battery and the deterioration information when the condition-of-use creator determines that an update to the value or the range is needed.

2. The charge/discharge control apparatus according to claim 1, wherein the condition of use includes a range of a value of a state of charge (SOC) allowed for the first battery.

3. The charge/discharge control apparatus according to claim 1, wherein the condition of use includes a range of a value of a current regarding charge or discharge of a secondary battery of the first battery to be charged.

4. The charge/discharge control apparatus according to claim 1, wherein the conditions of use include both of a range of a value of an SOC allowed for a secondary batter battery of the first battery to be charged or discharged and a range of a value of a current regarding charge or discharge of the secondary battery to be charged or discharged.

5. The charge/discharge control apparatus according to claim 1, wherein the at least one inner state parameter includes at least one of a capacity of a positive electrode or a mass of the positive electrode, a capacity of a negative electrode or a mass of the negative electrode, an SOC deviation, and an internal resistance.

6. The charge/discharge control apparatus according to claim 1, wherein the first battery is an assembled battery in which at least two secondary batteries are connected in series, and the charge/discharge controller is programmed to charge or discharge the assembled battery at a time when one of two secondary batteries having a battery larger in absolute value of a rate of change of a voltage relative to a state of charge (SOC) in absolute value satisfies the condition of use.

7. A power storage system comprising:

a first battery which is a secondary battery to be charged or discharged; and a charge/discharge control apparatus programmed to charge or discharge the first battery according to a value or a range of a state of charge (SOC) included in a condition of use to be satisfied during charge or discharge, wherein the charge/discharge control apparatus includes a measurer programmed to measure, on an ongoing basis, a voltage and a current of the first battery in charging or discharging the first battery;

a battery characteristic estimator programmed to estimate an estimation value of at least one inner state parameter of the first battery based on data on the voltage and current of the first battery measured in charging or discharging the first battery; and a condition-of-use calculator programmed to calculate the value or the range included in the condition of use from (a) deterioration information of the first battery and (b) the estimation value of the at least one inner state parameter of the first battery based on the data on the voltage and current of the first battery measured in charging or discharging the first battery, calculate on an ongoing basis a deterioration speed of the first battery based on the deterioration information and a new estimation value when the new estimation value is estimated, determine, on an ongoing basis, when updating the value or the range is needed based on the deterioration speed calculated on the ongoing basis and an upper limit of the deterioration speed, and update, on an ongoing basis, the value or the range based on the new estimation value and the deterioration information when the condition-of-use calculator determines that an update to the value or the range is needed, wherein the deterioration information indicates a relationship between a value of the at least one inner state parameter of the first battery and the deterioration speed of the first battery; and a charge/discharge controller programmed to control a current to/from the first battery to control the charge or discharge of the first battery (1) according to the value or the range in the condition of use initially calculated and (2) according to the value or the range in the condition of use updated based on the change of the at least one inner state parameter of the first battery and the deterioration information when the condition-of-use calculator determines that an update to the value or the range is needed.

8. A method of charging a first battery comprising:

measuring, on an ongoing basis during charging or discharging of the first battery, a voltage and a current of the first battery;

calculating, from (a) deterioration information of the first battery and (b) an estimation value of at least one inner state parameter of the first battery based on data on the voltage and current of the first battery measured in charging or discharging the first battery, a value or a range of a state of charge (SOC) included in a condition of use to be satisfied during charging or discharging, estimating a new estimation value, calculating on an ongoing basis a deterioration speed of the first battery based on the deterioration information and a new estimation value when the new estimation value is estimated, determining, on an ongoing basis, when updating the value or the range is needed based on the deterioration speed calculated on the ongoing basis and an upper limit of the deterioration speed, and updating, on an ongoing basis, the value or the range based on the new estimation value and the deterioration information when it is determined that an update to the value or the range is needed, wherein the deterioration information indicates a relationship between a value of the at least one inner state parameter of the first battery and the deterioration speed of the first battery; and controlling the charging or discharging of the first battery by controlling a current to/from the first battery (1) according to the value or the range in the condition of use initially calculated and (2) according to the value or the range in the condition of use updated based on the change of the at least one inner state parameter of the first battery and the deterioration information when it is determined that an update to the value or the range is needed.

9. The charge/discharge control apparatus according to claim 5, wherein the at least one inner state parameter is a capacity of a positive electrode or a mass of the positive electrode.

10. The charge/discharge control apparatus according to claim 5, wherein the at least one inner state parameter is a capacity of a negative electrode or a mass of the negative electrode.

11. The charge/discharge control apparatus according to claim 5, wherein the at least one inner state parameter is an SOC deviation.

12. The charge/discharge control apparatus according to claim 5, wherein the at least one inner state parameter is an internal resistance.

13. The charge/discharge control apparatus according to claim 1, further comprising a temperature measurer to measure a temperature of the first battery,
wherein the battery characteristic estimator is programmed to estimate the estimation value of at least one inner state parameter of the first battery based on (a) the temperature of the first battery and (2) data on the voltage and current of the first battery measured in charging or discharging the first battery.

14. The power storage system according to claim 7, further comprising a temperature measurer to measure a temperature of the first battery,
wherein the battery characteristic estimator is programmed to estimate the estimation value of at least one inner state parameter of the first battery based on (a) the temperature of the first battery and (2) data on the voltage and current of the first battery measured in charging or discharging the first battery.

15. The method according to claim 8, further comprising measuring a temperature of the first battery,
wherein estimating the new estimation comprises estimating the new estimation value based on (a) the temperature of the first battery and (2) data on the voltage and current of the first battery measured in charging or discharging the first battery.

* * * * *